(12) United States Patent
Huang et al.

(10) Patent No.: US 12,243,783 B2
(45) Date of Patent: Mar. 4, 2025

(54) EPITAXIAL SOURCE/DRAIN RECESS FORMATION WITH METAL-COMPRISING MASKING LAYERS AND STRUCTURES RESULTING THEREFROM

(71) Applicant: Taiwan Semiconductor Manufacturing Co., Ltd., Hsinchu (TW)

(72) Inventors: Hui-Lin Huang, Hsinchu (TW); Li-Li Su, Chubei (TW); Yee-Chia Yeo, Hsinchu (TW); Chii-Horng Li, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 85 days.

(21) Appl. No.: 17/232,898

(22) Filed: Apr. 16, 2021

(65) Prior Publication Data

US 2022/0246479 A1 Aug. 4, 2022

Related U.S. Application Data

(60) Provisional application No. 63/145,605, filed on Feb. 4, 2021.

(51) Int. Cl.
*H01L 21/8238* (2006.01)
*H01L 21/02* (2006.01)
(Continued)

(52) U.S. Cl.
CPC ........... *H01L 21/823814* (2013.01); *H01L 21/0259* (2013.01); *H01L 21/0332* (2013.01);
(Continued)

(58) Field of Classification Search
CPC ......... H01L 21/823814; H01L 21/0259; H01L 21/0332; H01L 21/28518;
(Continued)

(56) References Cited

U.S. PATENT DOCUMENTS 5,628,871 A * 5/1997 Shinagawa ....... H01L 21/31138
257/E21.256
6,737,313 B1 * 5/2004 Marsh .................. H10B 12/033
257/E21.018
(Continued)

FOREIGN PATENT DOCUMENTS

KR 20130107183 A 10/2013
KR 20160137966 A 12/2016
(Continued)

*Primary Examiner* — Thao X Le
*Assistant Examiner* — Sean Ayers Winters
(74) *Attorney, Agent, or Firm* — Slater Matsil, LLP

(57) ABSTRACT

A method includes etching a first recess adjacent a first dummy gate stack and a first fin; etching a second recess adjacent a second dummy gate stack and a second fin; and epitaxially growing a first epitaxy region in the first recess. The method further includes depositing a first metal-comprising mask over the first dummy gate stack, over the second dummy gate stack, over the first epitaxy region in the first recess, and in the second recess; patterning the first metal-comprising mask to expose the first dummy gate stack and the first epitaxy region; epitaxially growing a second epitaxy region in the first recess over the first epitaxy region; and after epitaxially growing the second epitaxy region, removing remaining portions of the first metal-comprising mask.

20 Claims, 46 Drawing Sheets

(51) Int. Cl.
  *H01L 21/033* (2006.01)
  *H01L 21/285* (2006.01)
  *H01L 27/092* (2006.01)
  *H01L 29/06* (2006.01)
  *H01L 29/417* (2006.01)
  *H01L 29/423* (2006.01)
  *H01L 29/45* (2006.01)
  *H01L 29/66* (2006.01)
  *H01L 29/786* (2006.01)

(52) U.S. Cl.
  CPC .......... *H01L 21/28518* (2013.01); *H01L 21/823807* (2013.01); *H01L 21/823828* (2013.01); *H01L 21/823864* (2013.01); *H01L 21/823871* (2013.01); *H01L 27/092* (2013.01); *H01L 29/0665* (2013.01); *H01L 29/41733* (2013.01); *H01L 29/42392* (2013.01); *H01L 29/45* (2013.01); *H01L 29/66545* (2013.01); *H01L 29/66553* (2013.01); *H01L 29/66636* (2013.01); *H01L 29/66742* (2013.01); *H01L 29/78618* (2013.01); *H01L 29/78696* (2013.01)

(58) Field of Classification Search
  CPC ..... H01L 21/823807; H01L 21/823828; H01L 21/823864; H01L 21/823871; H01L 27/092; H01L 29/0665; H01L 29/41733; H01L 29/42392; H01L 29/45; H01L 29/66545; H01L 29/66553; H01L 29/66636; H01L 29/66742; H01L 29/78618; H01L 29/78696
  See application file for complete search history.

(56) References Cited

U.S. PATENT DOCUMENTS

| | | | |
|---|---|---|---|
| 6,749,687 B1* | 6/2004 | Ferro | H01L 21/02576 257/E21.426 |
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,722,065 B1* | 8/2017 | Lin | H01L 29/0661 |
| 10,050,125 B1* | 8/2018 | Qi | H01L 21/76895 |
| 10,229,986 B1* | 3/2019 | Jagannathan | H01L 29/7827 |
| 10,236,218 B1 | 3/2019 | Kie et al. | |
| 10,777,664 B2 | 9/2020 | Hung et al. | |
| 2002/0187622 A1* | 12/2002 | Bartsch | H01L 21/0495 438/570 |
| 2003/0213987 A1* | 11/2003 | Basceri | H01L 28/91 257/E29.345 |
| 2004/0121548 A1* | 6/2004 | Fishburn | H01L 21/823828 438/634 |
| 2007/0080360 A1* | 4/2007 | Mirsky | H01L 23/3735 257/706 |
| 2010/0319614 A1 | 12/2010 | Satoh et al. | |
| 2011/0175147 A1* | 7/2011 | Adusumilli | H01L 21/28088 257/E21.177 |
| 2013/0248948 A1 | 9/2013 | Ma et al. | |
| 2014/0319614 A1* | 10/2014 | Paul | H01L 29/785 257/365 |
| 2015/0214059 A1 | 7/2015 | Bouche et al. | |
| 2016/0099246 A1 | 4/2016 | Basker et al. | |
| 2017/0110554 A1 | 4/2017 | Tak et al. | |
| 2017/0125527 A1 | 5/2017 | Pillarisetty et al. | |
| 2017/0250261 A1 | 8/2017 | Kim et al. | |
| 2018/0233557 A1* | 8/2018 | Cheng | H01L 29/401 |
| 2018/0294331 A1 | 10/2018 | Cho et al. | |
| 2019/0067126 A1* | 2/2019 | Chen | H01L 21/02532 |
| 2019/0067286 A1 | 2/2019 | Li | |
| 2019/0115249 A1* | 4/2019 | Koh | H01L 21/283 |
| 2019/0140064 A1* | 5/2019 | Bi | H01L 21/823468 |
| 2019/0279992 A1 | 9/2019 | Yu et al. | |
| 2019/0295960 A1 | 9/2019 | Kuan et al. | |
| 2020/0083352 A1* | 3/2020 | Chanemougame | H01L 29/6681 |
| 2020/0098879 A1 | 3/2020 | Lee et al. | |
| 2020/0126798 A1* | 4/2020 | Lin | B82Y 10/00 |
| 2020/0287046 A1* | 9/2020 | Frougier | H01L 21/823431 |
| 2020/0294969 A1* | 9/2020 | Rachmady | H01L 27/088 |
| 2021/0343859 A1 | 11/2021 | Son et al. | |

FOREIGN PATENT DOCUMENTS

| | | |
|---|---|---|
| KR | 20170044525 A | 4/2017 |
| KR | 20170101729 A | 9/2017 |
| KR | 20180113118 A | 10/2018 |
| KR | 20200035896 A | 4/2020 |
| KR | 20200111997 A | 10/2020 |

* cited by examiner

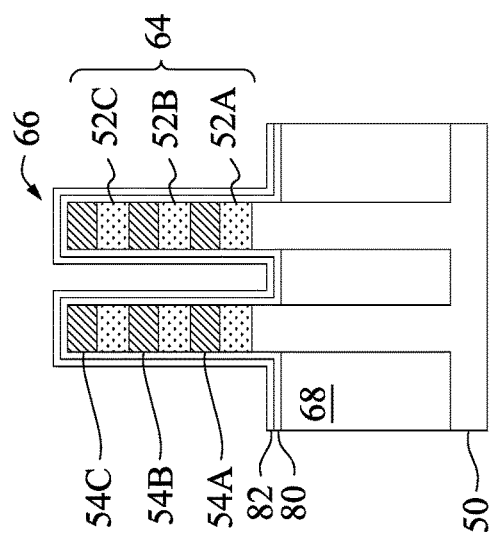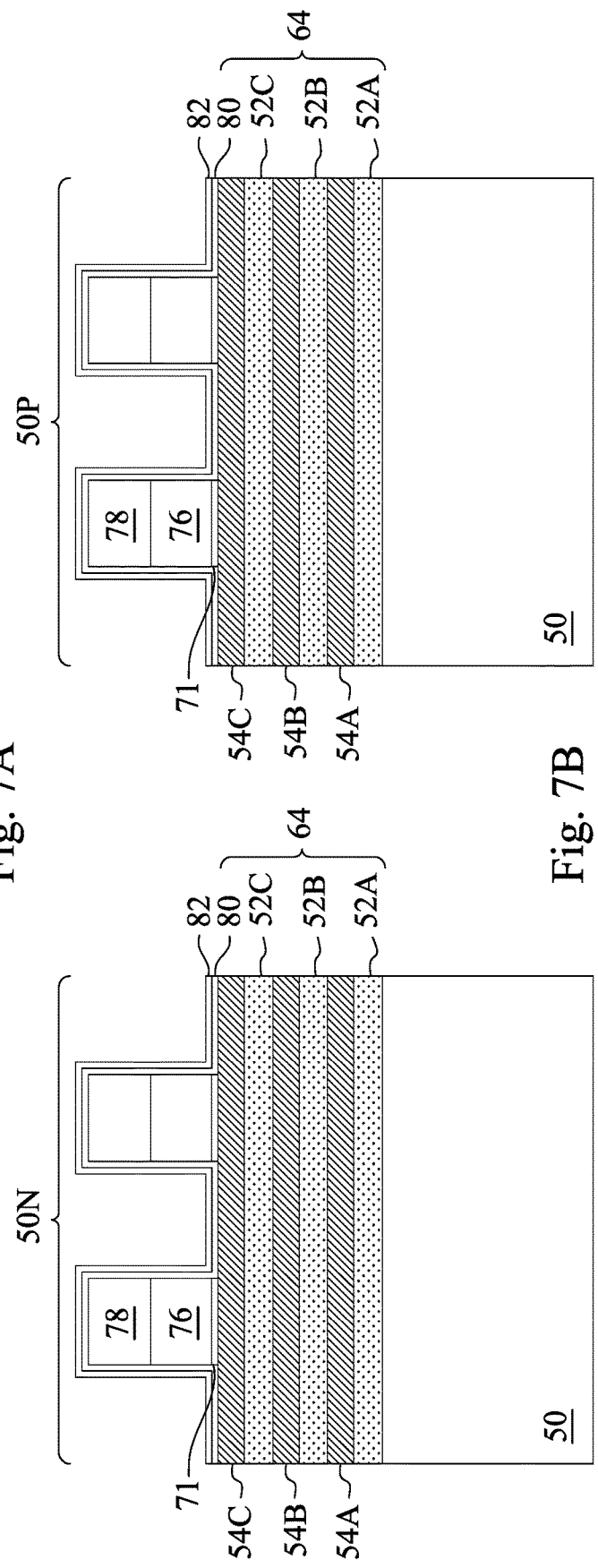
Fig. 7A
Fig. 7B

EPITAXIAL SOURCE/DRAIN RECESS FORMATION WITH METAL-COMPRISING MASKING LAYERS AND STRUCTURES RESULTING THEREFROM

PRIORITY CLAIM AND CROSS-REFERENCE

This application claims the benefit of U.S. Provisional Application No. 63/145,605, filed on Feb. 4, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B 8A, 8B, 9A, 9B, 10A, 10B, 11A, 11B, 11C, 12, 13, 14, 15, 16, 17A, 17B, 17C, 18, 19, 20, 21, 22, 23A, 23B, 23C, 24, 25A, 25B, 25C, 26A, 26B, 27A, 27B, 28A, 28B, 29A, 29B, 30A, 30B, 30C, 31A, 31B, 31C, 32A, 32B, and 32C are cross-sectional views of intermediate stages in the manufacturing of nano-FETs, in accordance with some embodiments.

DETAILED DESCRIPTION

Figure 1:
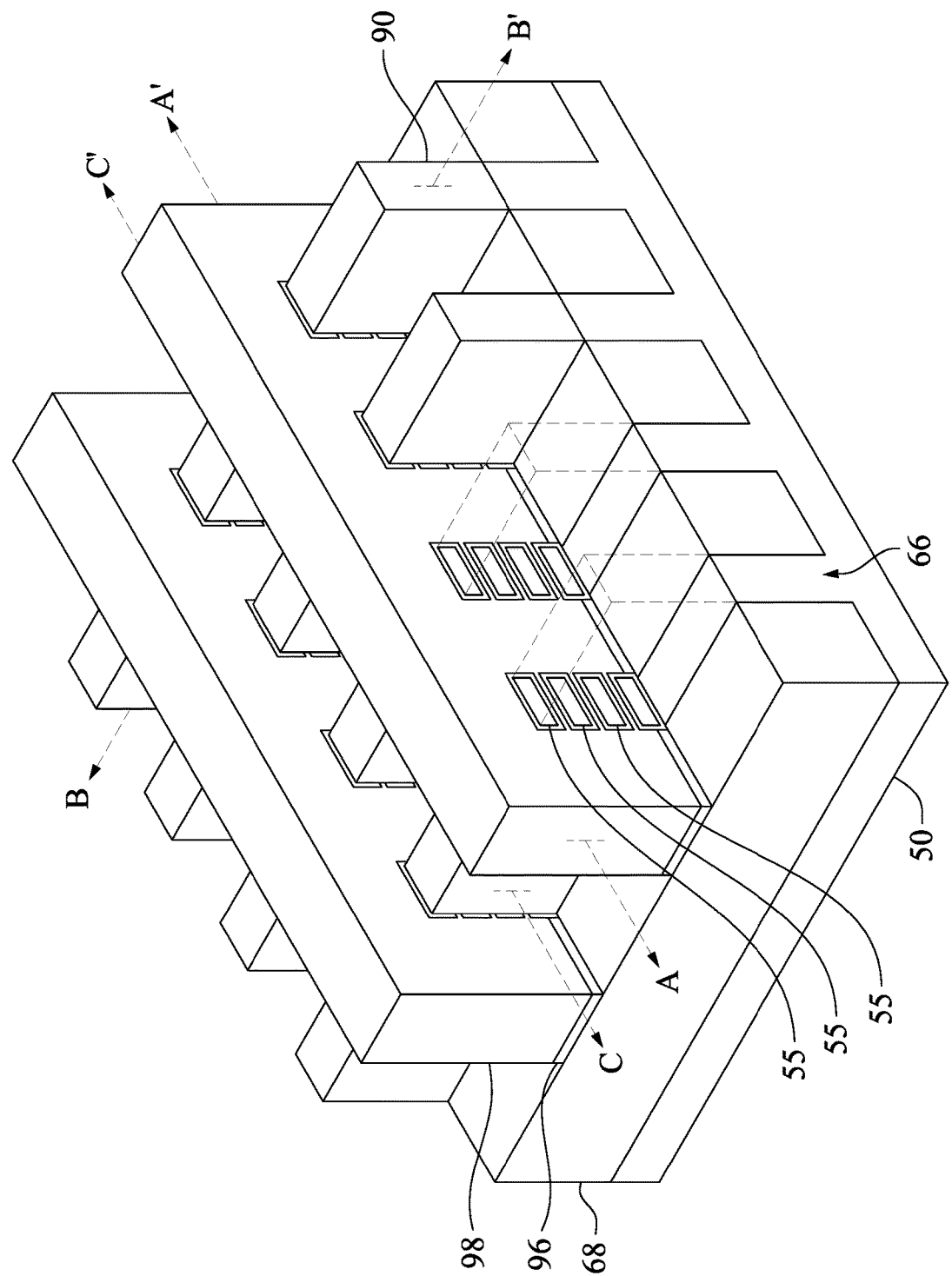
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a metal-comprising mask during source/drain epitaxy processes for forming source/drain regions in n-type and p-type device regions of a semiconductor die. The metal-comprising mask protects structures in the n-type or p-type device regions of the die while source/drain regions for the other type device are grown. In some embodiments, the metal-comprising mask comprises aluminum oxide, hafnium oxide, aluminum nitride, or the like. It has been observed that a metal oxide may be less prone to absorb precursors flowed during the source/drain epitaxy. For example, the initial nucleation reaction between the metal-comprising mask and the precursors may provide relatively high energy bonds between the metal-comprising mask and the precursor. As a result, the precursors may remain on a surface of the metal-comprising mask rather than be absorbed into the metal oxide mask, precursor residue may be more readily removed during wet clean processes to remove the metal-comprising mask, and defects can be reduced in the resulting device. Source/drain processing windows can also be advantageously improved. Further, the use of metal-comprising masks may allow for more bottom-up source/drain growth as the metal-comprising mask may leave a residue along sidewalls of an STI region that helps inhibit epitaxy growth along the <100> crystalline planes.

Embodiments are described below in a particular context, a die comprising nano-FETs. Various embodiments may be applied, however, to dies comprising other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nano-structures 55 (e.g., nanosheets, nanowire, or the like) over fins 66 on a substrate 50 (e.g., a semiconductor substrate), wherein the nano-structures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 96 are over top surfaces of the fins 66 and along top surfaces, sidewalls, and bottom surfaces of the nano-structures 55. Gate electrodes 98 are over the gate dielectric layers 96. Epitaxial source/drain regions 90 are disposed on the fins 66 on opposing sides of the gate dielectric layers 96 and the gate electrodes 98.

FIG. 1 further illustrates reference cross-sections that are used in later figures. Cross-section A-A' is along a longitudinal axis of a gate electrode 98 and in a direction, for example, perpendicular to the direction of current flow between the epitaxial source/drain regions 90 of a nano-FET. Cross-section B-B' is perpendicular to cross-section A-A' and is parallel to a longitudinal axis of a fin 66 of the nano-FET and in a direction of, for example, a current flow between the epitaxial source/drain regions 90 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 32C are cross-sectional views of intermediate stages in the manufacturing of nano-FETs, in accordance with some embodiments. FIGS. 2 through 5, 6A, 25A, 26A, 27A, 28A, 29A, 30A, 31A, and 32A illustrate reference cross-section A-A' illustrated in FIG. 1. FIGS. 6B, 7B, 8B, 9B, 10B, 11B, 11C, 12, 13, 14, 15, 16, 17A, 18, 19, 20, 21, 22, 23A, 24, 25B, 26B, 27B, 28B, 29B, 30B, 31B, and 32B illustrate reference cross-section B-B' illustrated in FIG. 1. FIGS. 7A, 8A, 9A, 10A, 11A, 17B, 17C, 23B, 23C, 25C, 30C, 31C, and 32C illustrate reference cross-section C-C' illustrated in FIG. 1.

Figure 2:
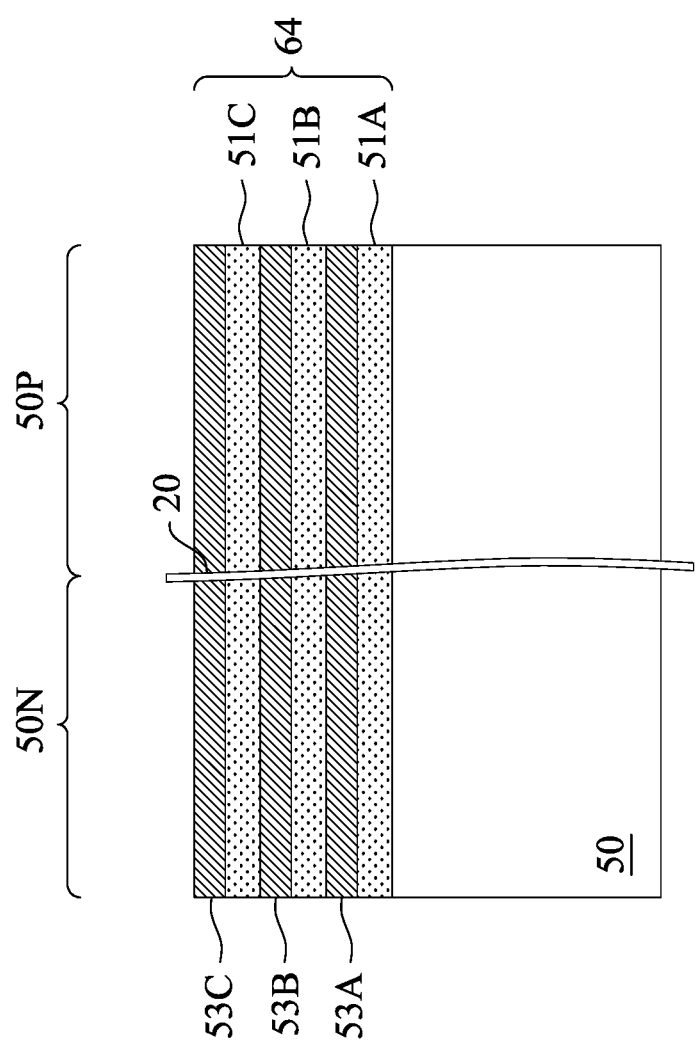

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type regions 50N. Nevertheless, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type regions 50P. In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of non-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type NSFETS. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type NSFETS.

Figure 3:
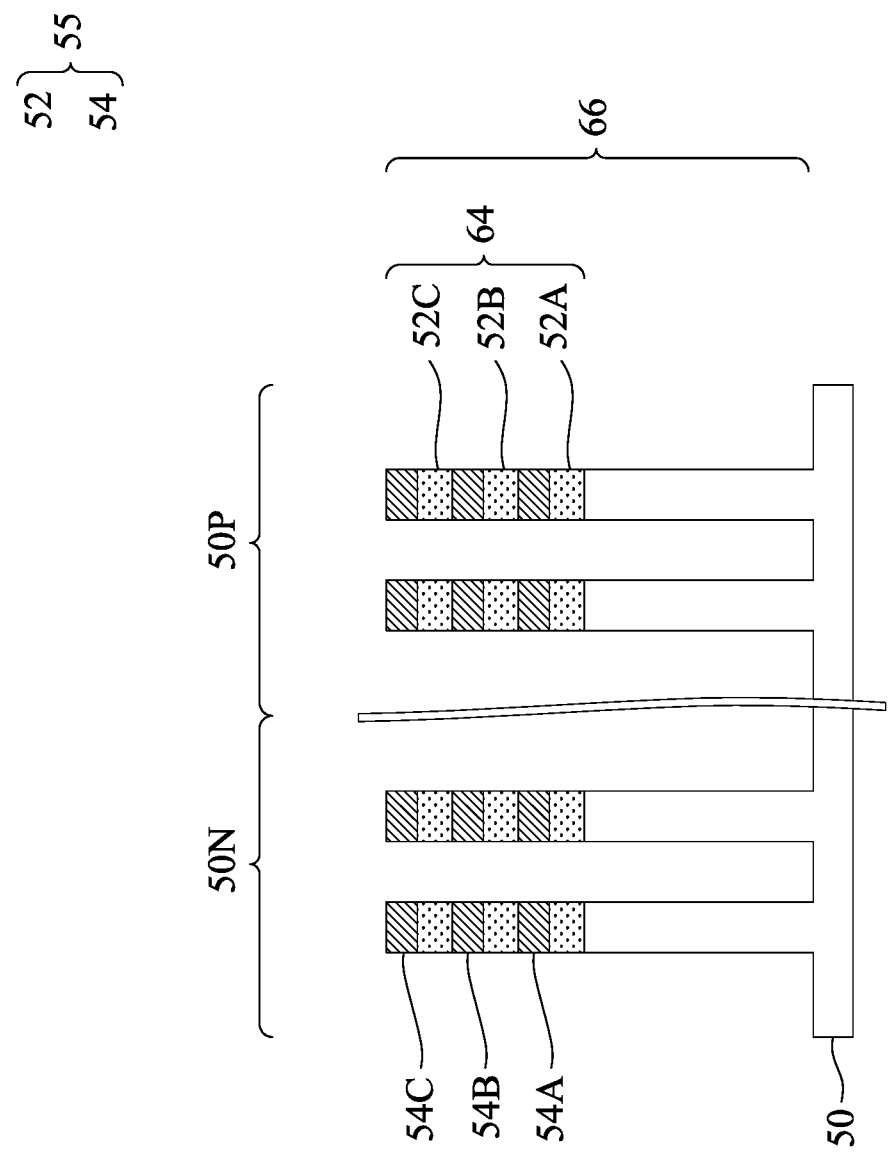

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
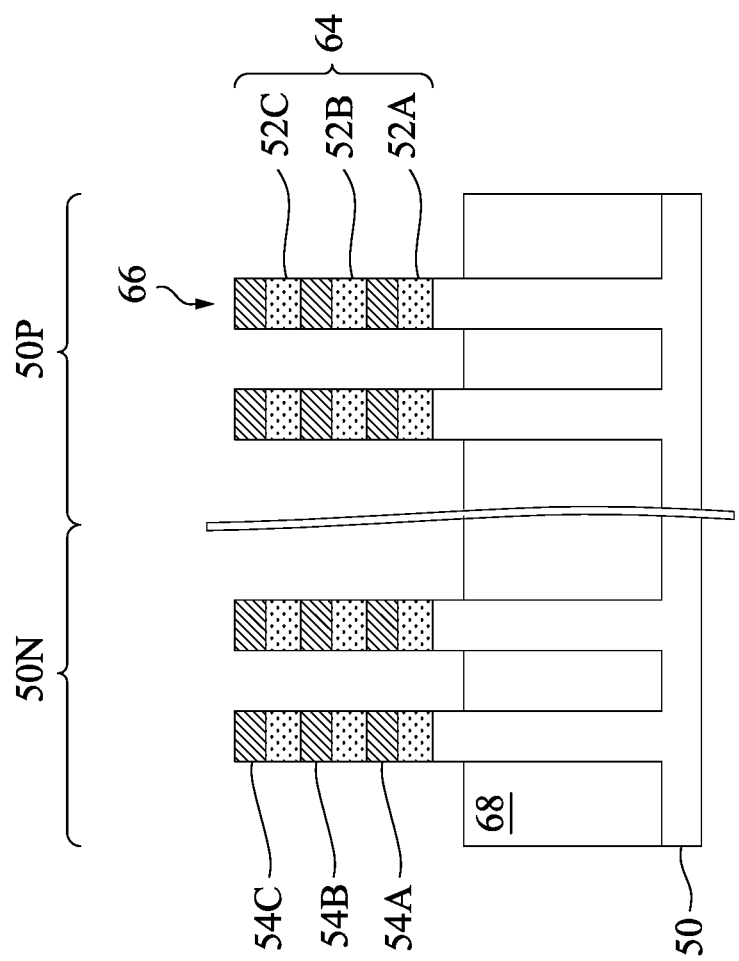

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the regions 50N and the region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting nanostructures 52) and the second semiconductor layers 53 (and resulting nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
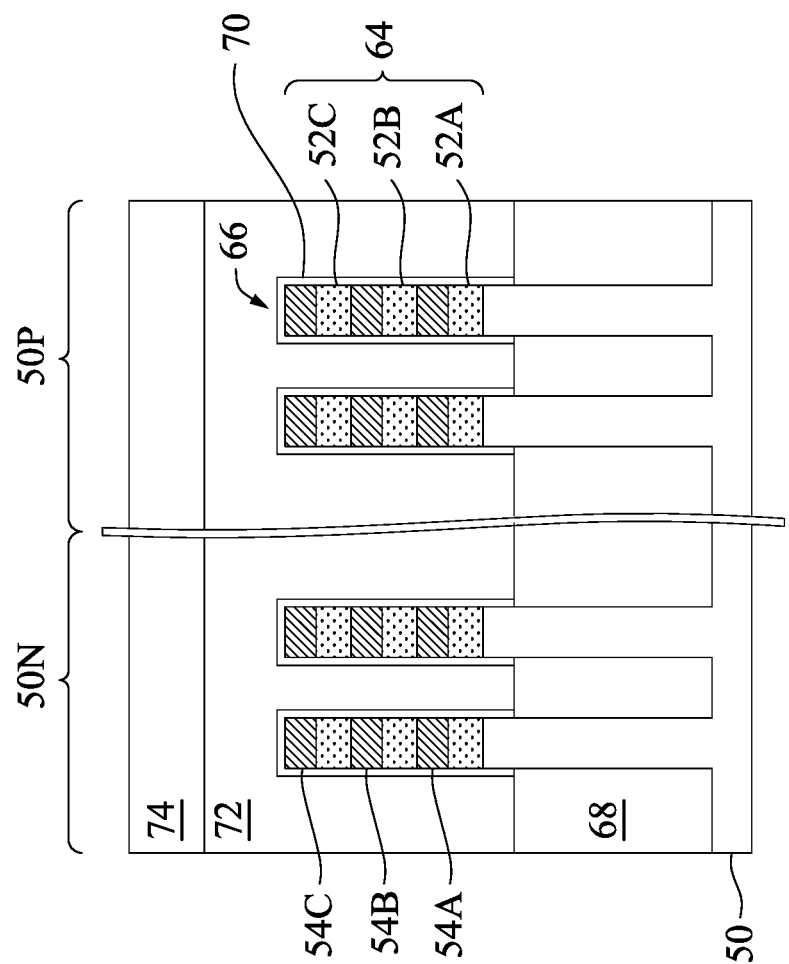

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
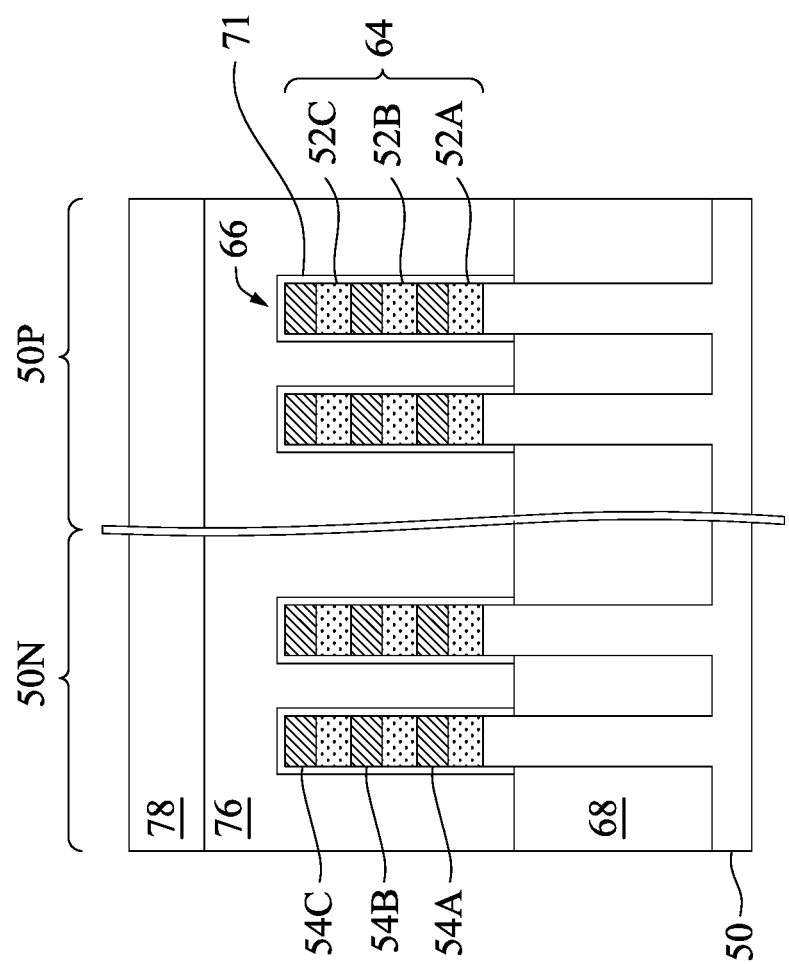

FIGS. 6A through 11C illustrate various additional steps in the manufacturing of embodiment devices. FIGS. 7A, 8A, 9A, 10A, and 11A illustrate features in either the regions 50N or the regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 6B:
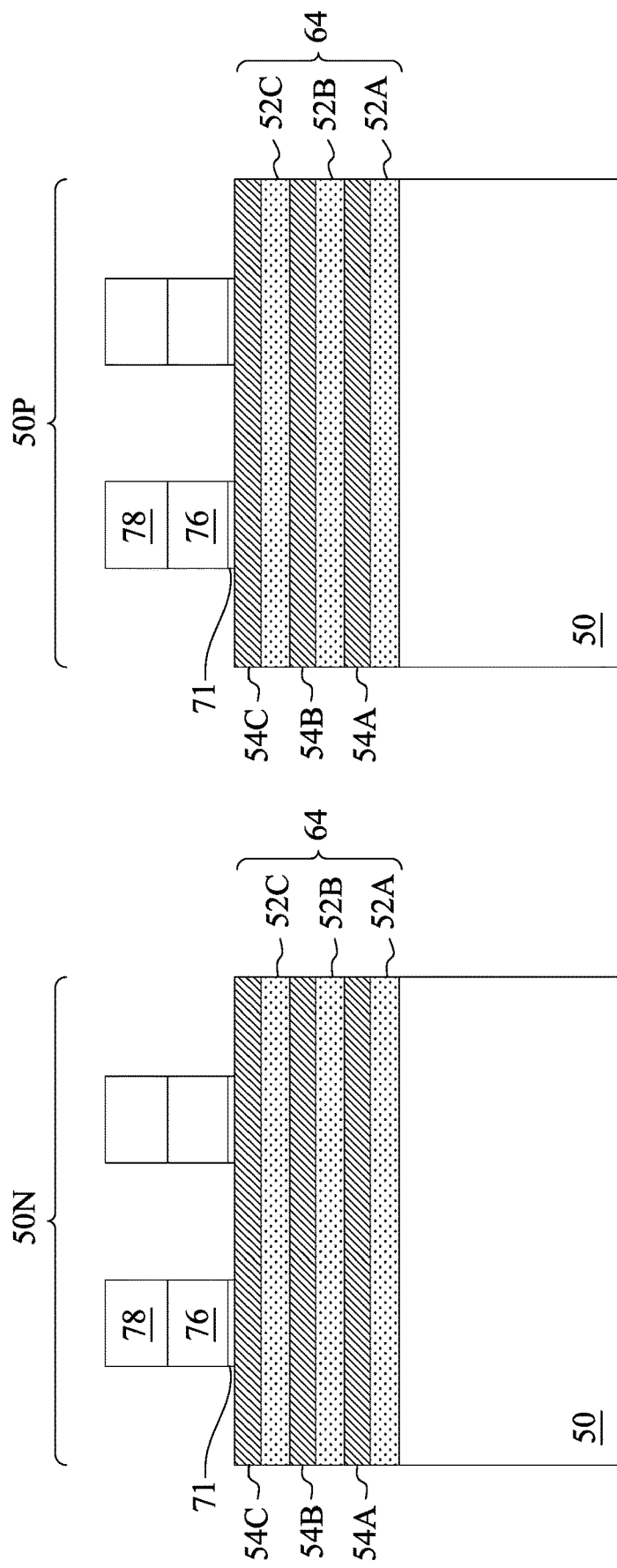

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1 \times 10^{15}$ atoms/cm$^3$ to about $1 \times 10^{19}$ atoms/cm$^3$. An anneal may be used to repair implant damage and to activate the implanted impurities.

Figure 8A:
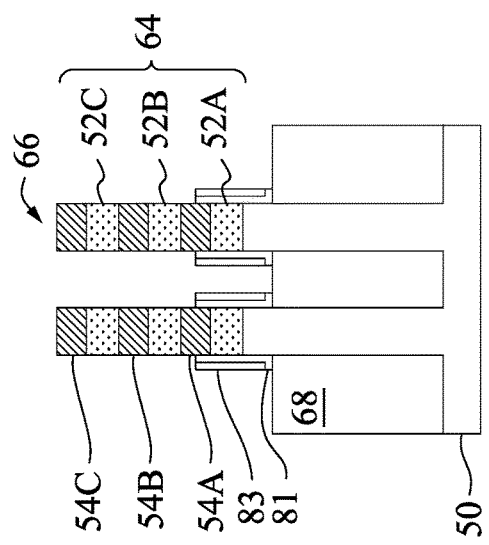
Figure 8B:
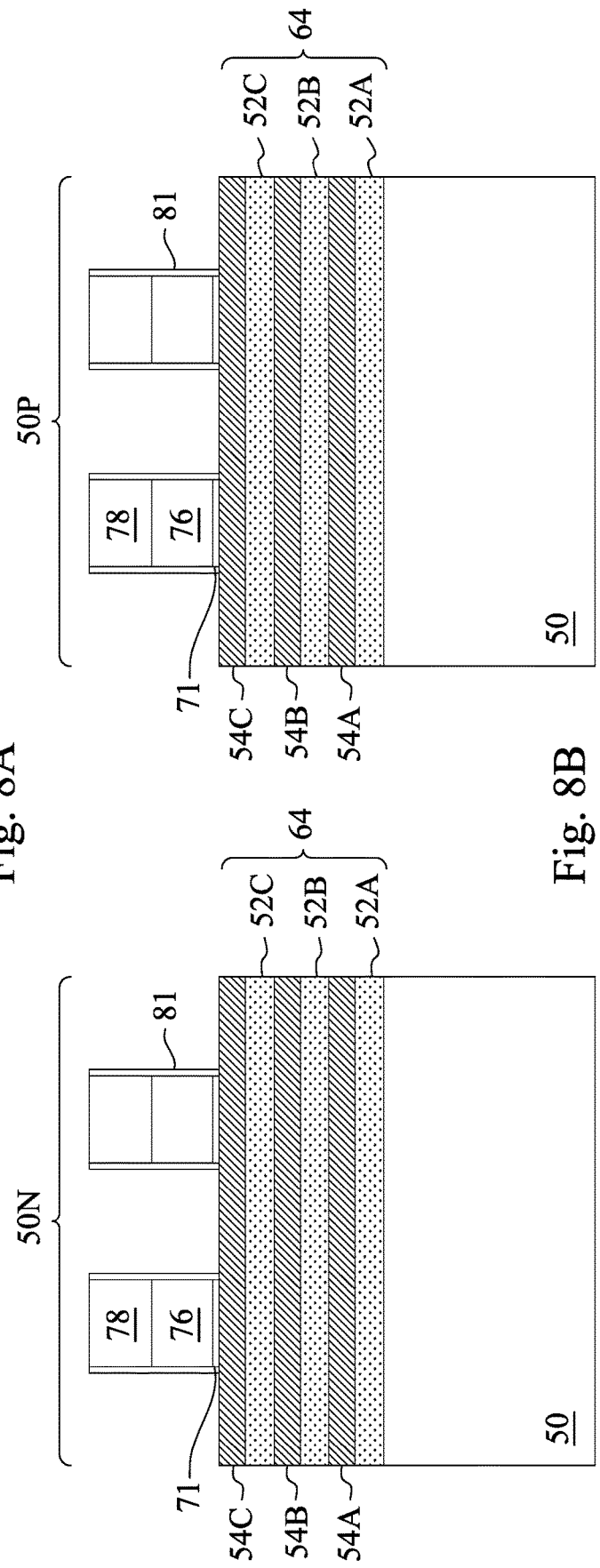

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy dielectric layers 60. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
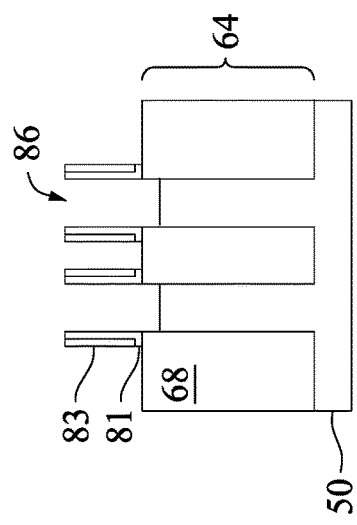
Figure 9B:
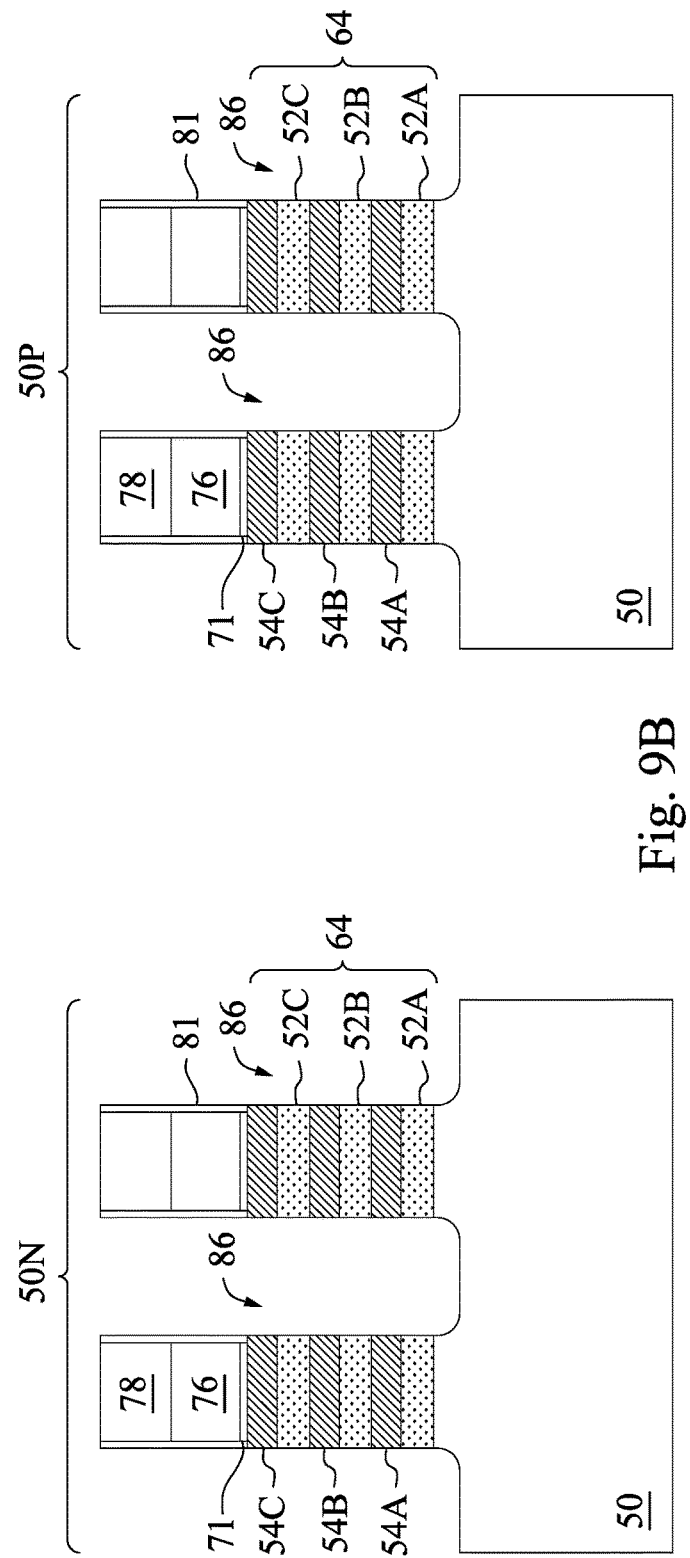

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 58 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10A:
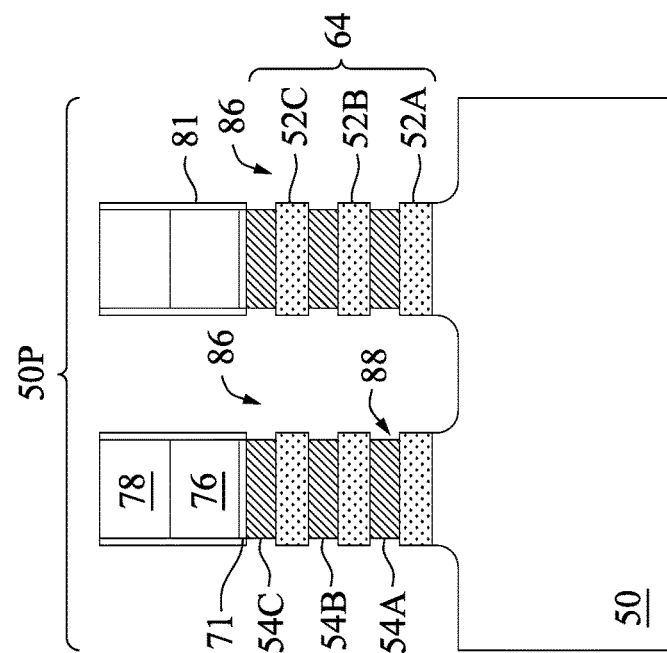
Figure 10A:
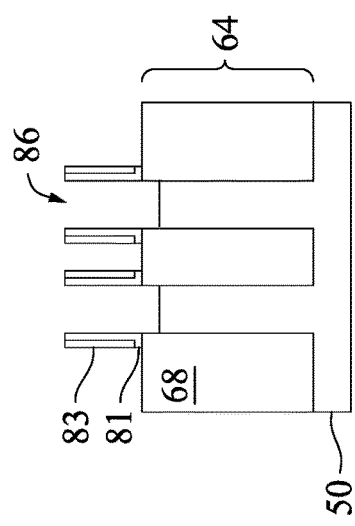
Figure 10B:
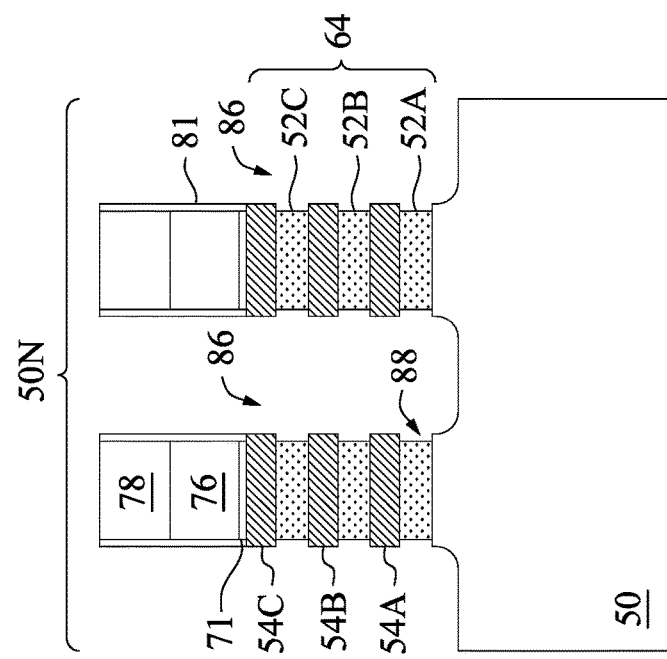

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 56 formed of the second semiconductor materials (e.g., the second nanostructures 54) exposed by the first recesses 86 are etched to form sidewall recesses 88 in the p-type region 50N. Although sidewalls of the first nanostructures 52 and the second nanostructures 54 in recesses 88 are illustrated as being straight in FIG. 10B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52 in the n-type region 50N, and a dry etch process with hydrogen fluoride, another fluorine-based etchant, or the like may be used to etch sidewalls of the second nanostructures 54 in the p-type region 50P.

Figure 11A:
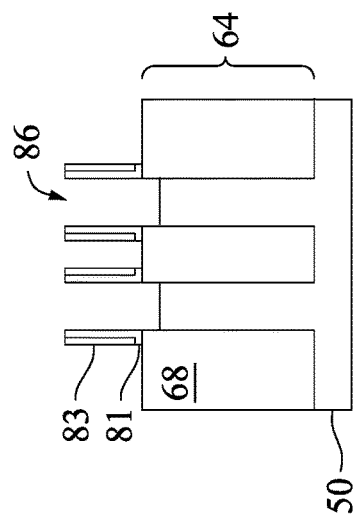
Figure 11B:
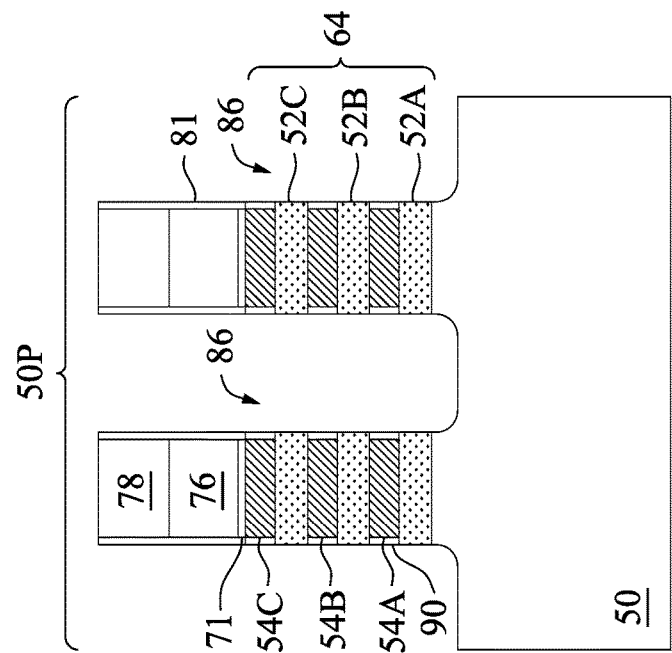
Figure 11B:
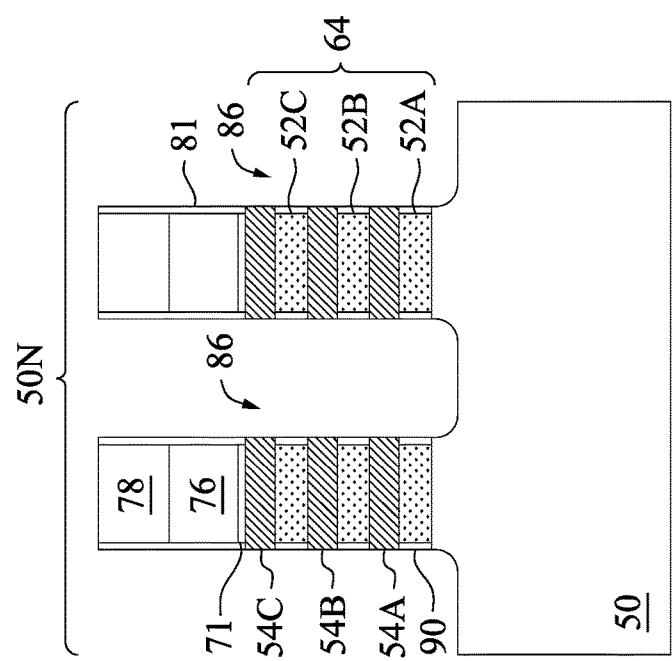
Figure 11C:
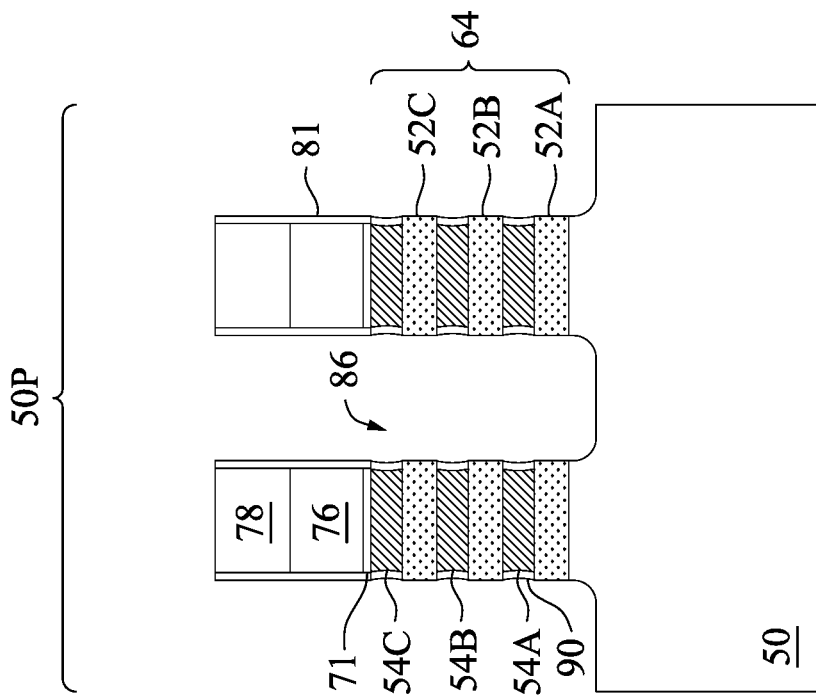
Figure 11C:
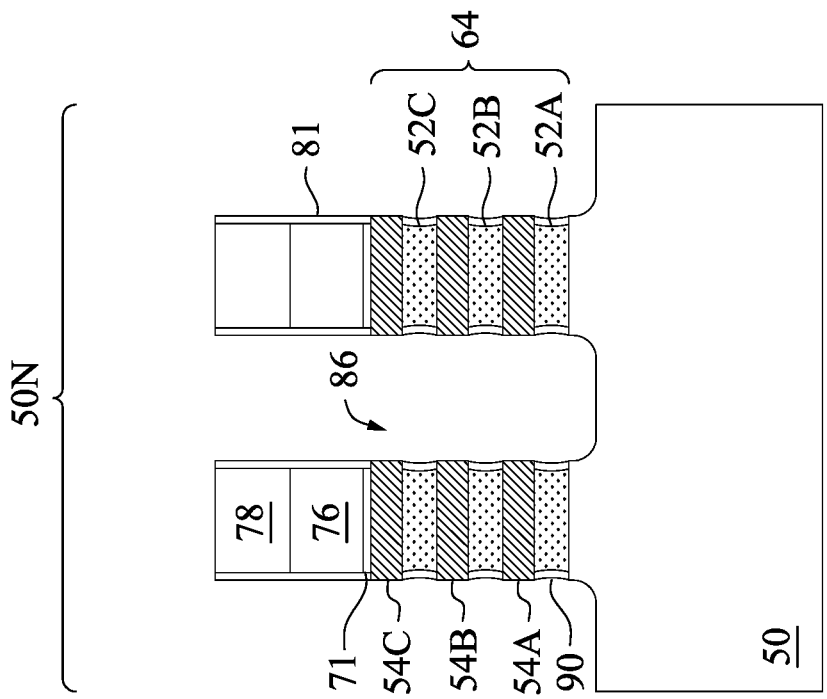

In FIGS. 11A-11C, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the recesses 86, while the first nanostructures 52 in the n-type region 50N and the second nanostructures 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers are recessed from sidewalls of the second nanostructures 54 in the n-type region 50N. Also illustrated are embodiments in which sidewalls of the second nanostructures 54 are concave, outer sidewalls of the first inner spacers 90 are concave, and the first inner spacers are recessed from sidewalls of the first nanostructures 52 in the p-type region 50P. The inner spacer layer may be etched by an anisotropic etching process, such as RIE, NBE, or the like. The first inner spacers 90 may be used to prevent damage to subsequently formed source/drain regions (such as the epitaxial source/drain regions 92 and 93, discussed below) by subsequent etching processes, such as etching processes used to form gate structures.

Figure 12:
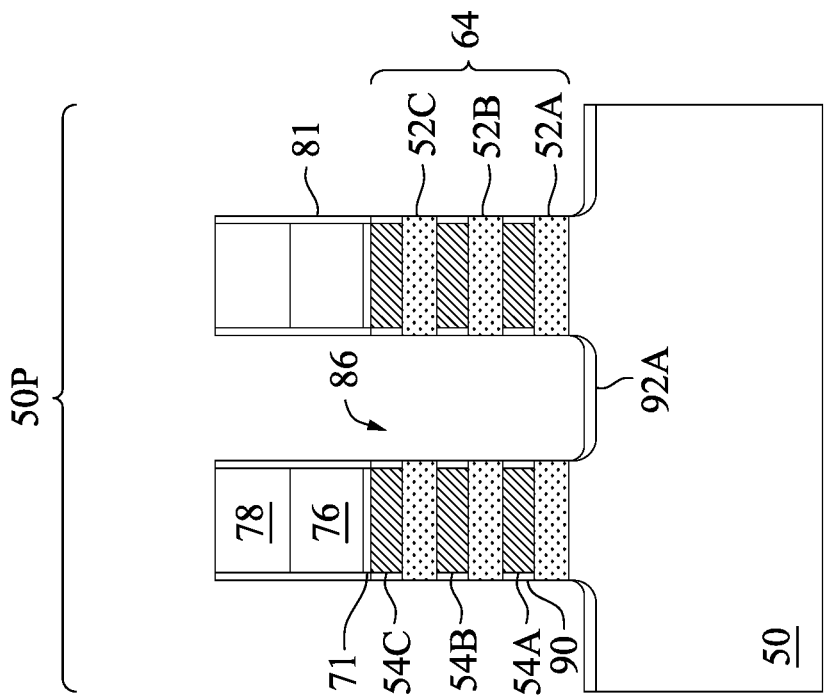
Figure 12:
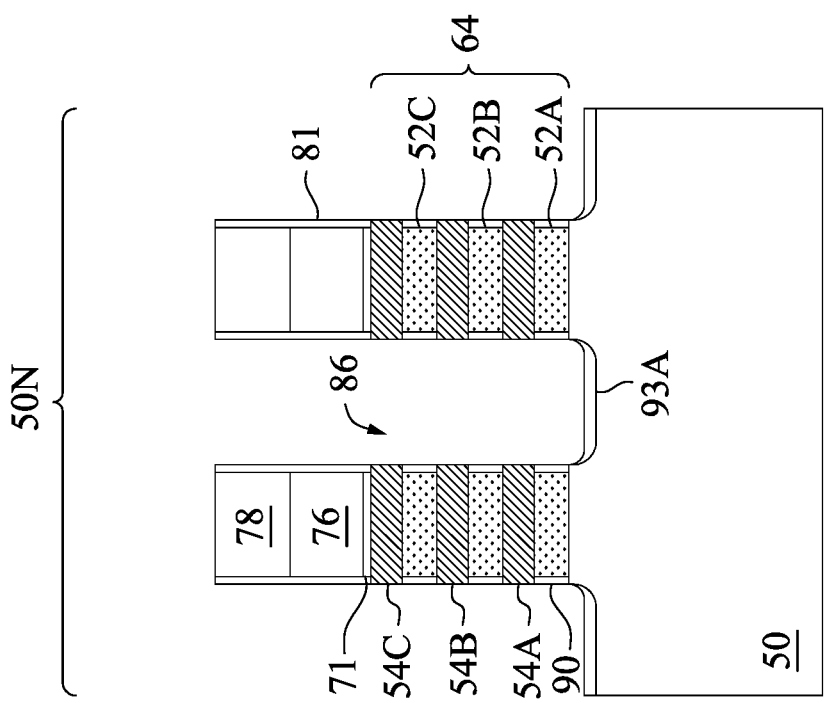

In FIG. 12, first epitaxy regions 92A are formed in the first recesses 86 in the p-type region 50P, and first epitaxy regions 93A are formed in the first recesses 86 in the n-type region 50N. The first epitaxy regions 92A and 93A may comprise a silicon cobalt nickel alloy (SiCoNi), un-doped silicon, lightly doped silicon, or the like. The first epitaxy regions 92A and 93A may be grown by any suitable epitaxy process to partially fill the first recesses 86. For example, the first epitaxy regions 92A and 93A may have a top surface that is lower than or level with a bottommost nanostructure of the multilayer stack 64 (e.g., the first nanostructure 52A). In other embodiments, the top surface of the first epitaxy regions 92A and 93A may be disposed at a different level relative to the multilayer stack 64.

The first epitaxy regions 92A and 93A may be implanted with dopants, similar to the process previously discussed for forming lightly-doped source/drain regions, followed by an anneal. The impurities implanted in the p-type regions 50P and the n-type regions 50N may be the same or different and may be any of the impurities previously discussed. In some embodiments, the first epitaxy regions 92A and 93A may be in situ doped during growth. The first epitaxy regions 92A and 93A may be a buffer layer, which is lightly doped to have a more similar crystalline structure as the substrate 50 than subsequently formed epitaxial regions that are grown on the first epitaxy regions 92A and 93A (e.g., the epitaxy regions 92B and 93B, see FIG. 24). As such, the first epitaxy regions 92A and 93A may be serve as a transition region that reduces crystalline mismatch between the underlying substrate 50 and the overlying epitaxy regions (e.g., the epitaxy regions 92B and 93B, see FIG. 24).

Figure 13:
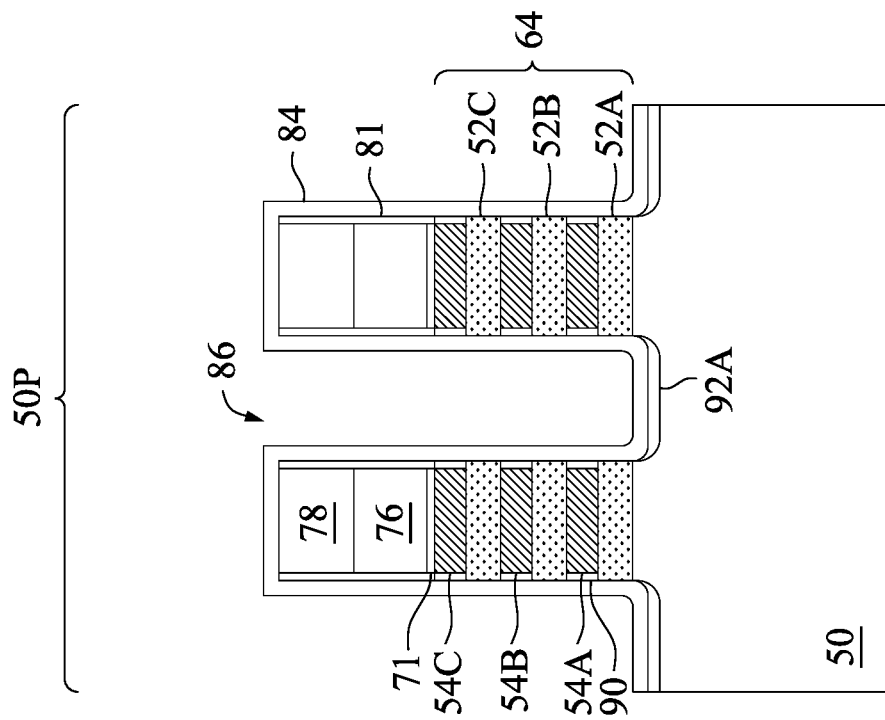
Figure 13:
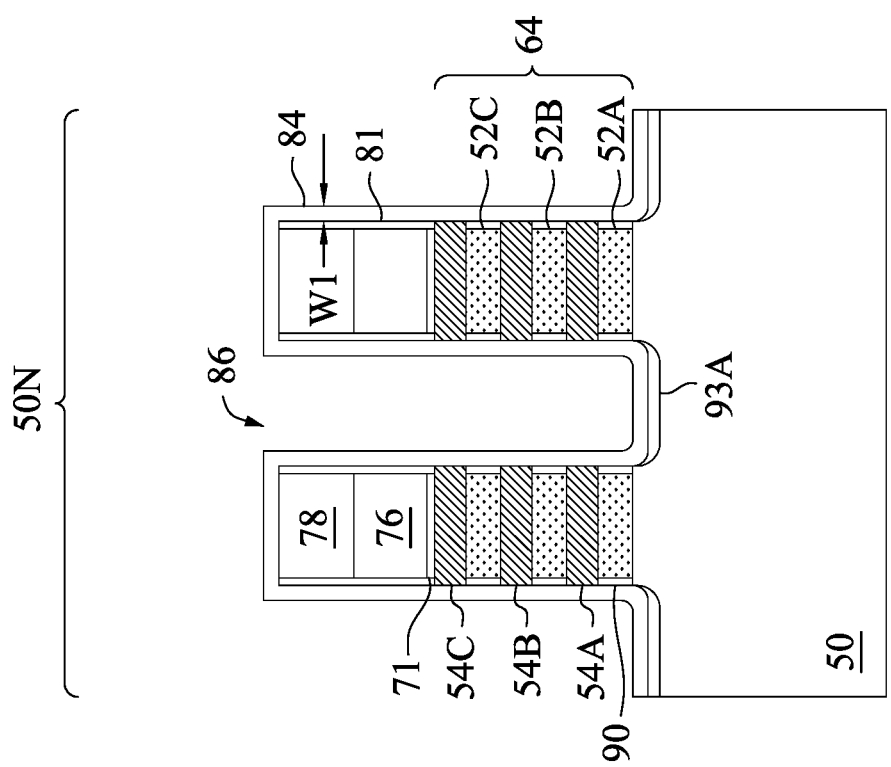

In FIG. 13, a mask layer 84 is deposited in the n-type region 50N and p-type region 50P. The mask layer 84 may be a conformal layer that is deposited along sidewalls and a bottom surface of the recesses 86, such as along sidewalls of the first nanostructures 52, the second nanostructures 54, and the inner spacers 90 and along an upper surface of the first epitaxy regions 92A and 93A. The mask layer 84 may be further be deposited to cover top surfaces and sidewalls of the masks 78, the dummy gates 76, and the dummy gate dielectrics 71. The mask layer 84 may be a metal-comprising mask layer and may comprise, aluminum oxide, aluminum nitride, hafnium oxide, or the like. The mask layer 84 may be deposited using a suitable process, such as PVD, CVD, ALD, or the like. For example, depositing the mask layer 84 may be an ALD process performed at a temperature in a range of about 150° C. to about 320° C.; at a pressure in a range of about 1 Torr to about 10 Torr; and with a pulse time in a range of 50 ms to about 200 ms. Further, in embodiments where the mask layer 84 comprises aluminum oxide, trimethyl aluminum and water may be flowed during the ALD deposition process as precursors. In embodiments where the mask layer 84 comprises aluminum nitride, trimethyl aluminum and a nitrogen source (e.g., $NH_3$, $N_2H_4$, or the like) may be flowed during the ALD deposition process as precursors. In embodiments where the mask layer 84 comprises hafnium oxide, trimethyl hafnium and water may be flowed during the ALD deposition process as precursors. The mask layer 84 may have a width W1 in a range of about 1 nm to about 5 nm.

Figure 14:
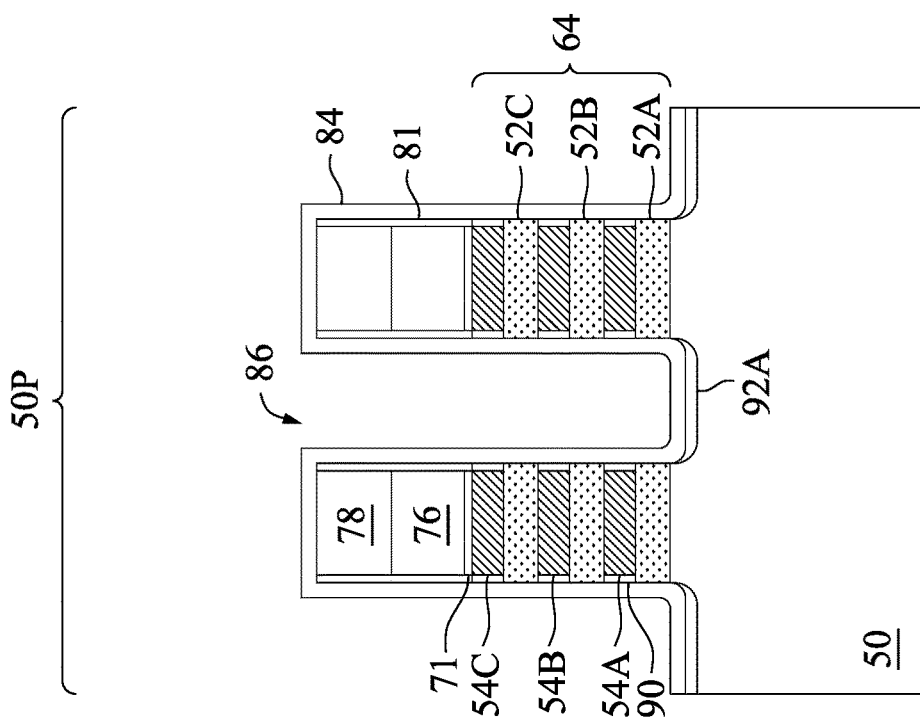
Figure 14:
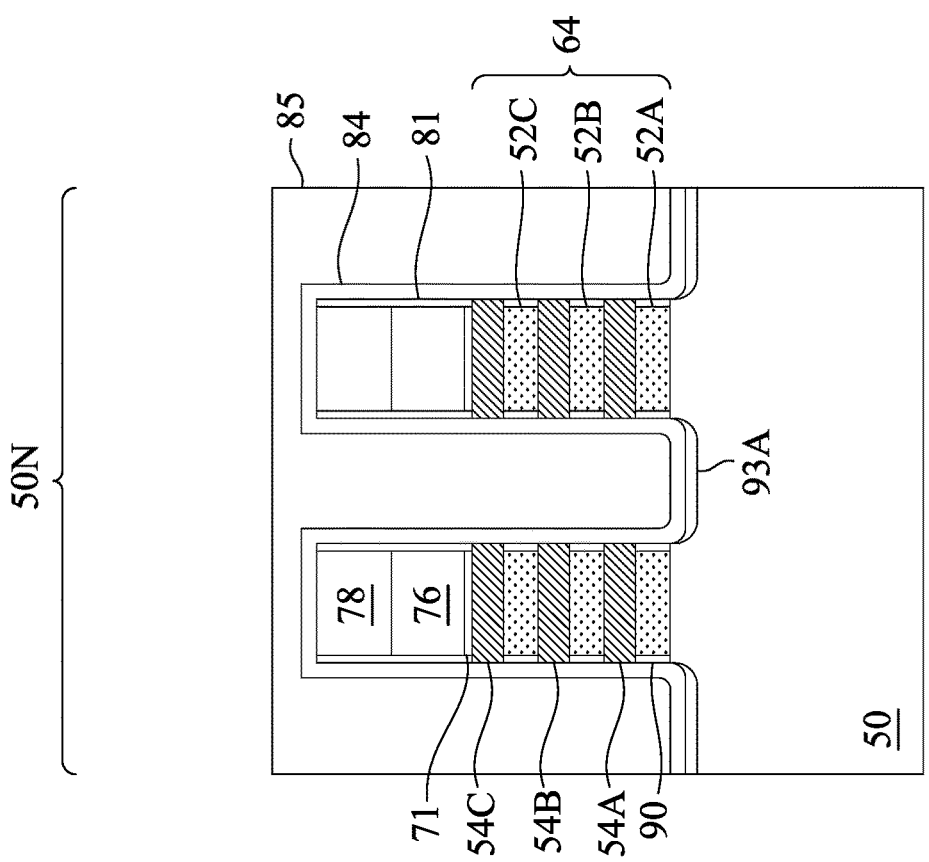

In FIG. 14, a photoresist 85 is deposited and patterned. The photoresist 85 can be formed by using a spin-on technique, for example, and can be patterned using acceptable photolithography techniques. The photoresist 85 may be patterned to expose the p-type region 50P while covering the n-type region 50N. Although the photoresist 85 is illustrated as a single, it should be understood that the photoresist 85 may have a multilayer structure. In some embodiments, the photoresist 85 may be or comprise a backside anti-reflective coating (BARC) material.

Figure 15:
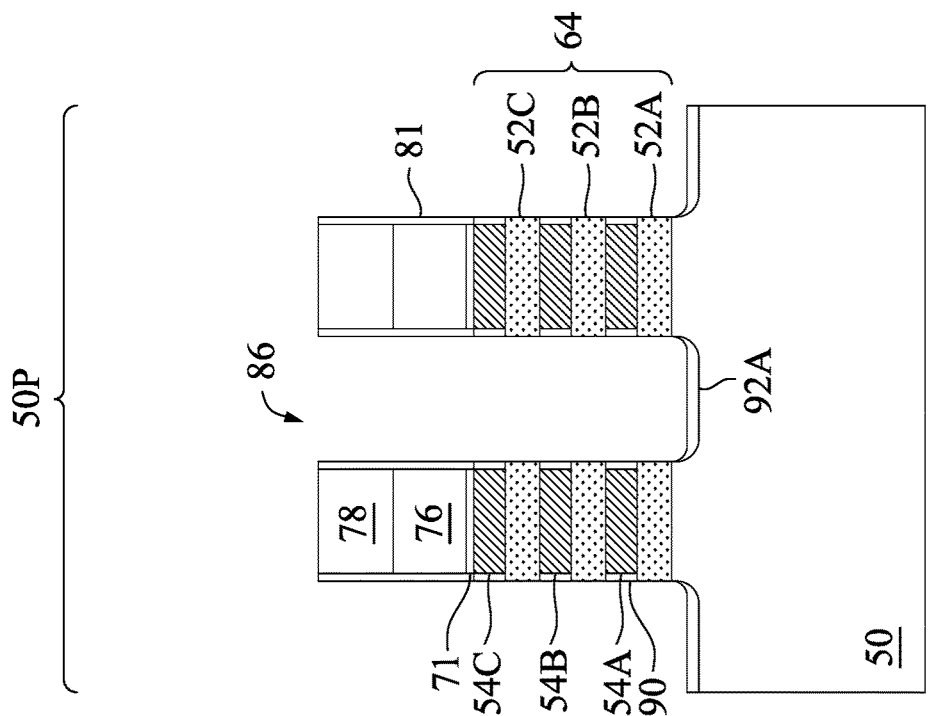
Figure 15:
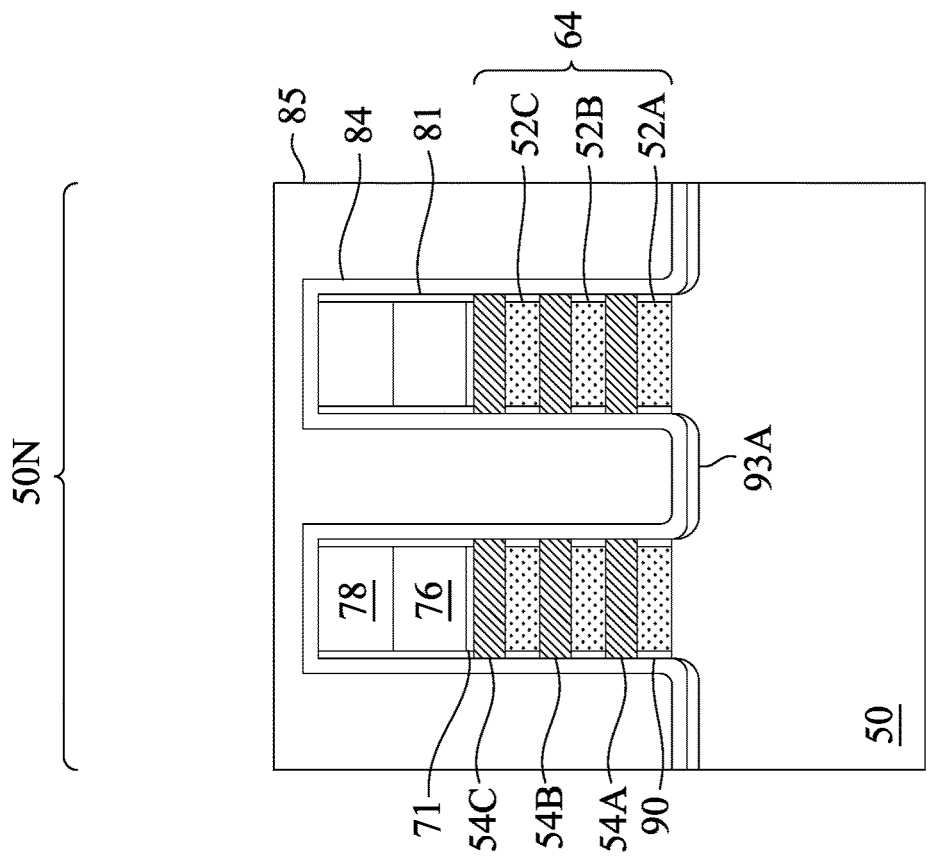
Figure 16:
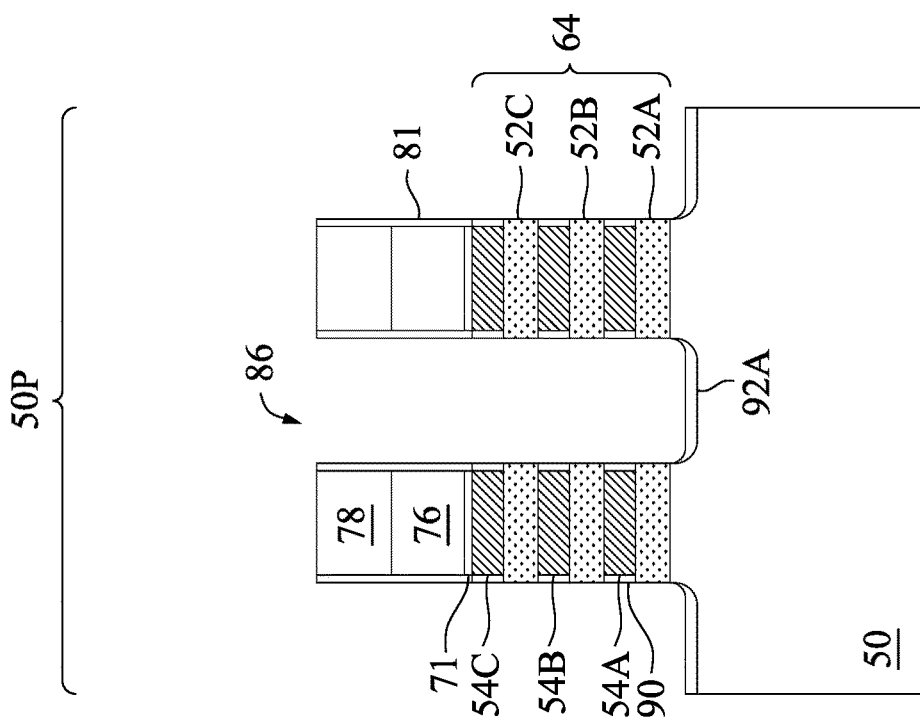
Figure 16:
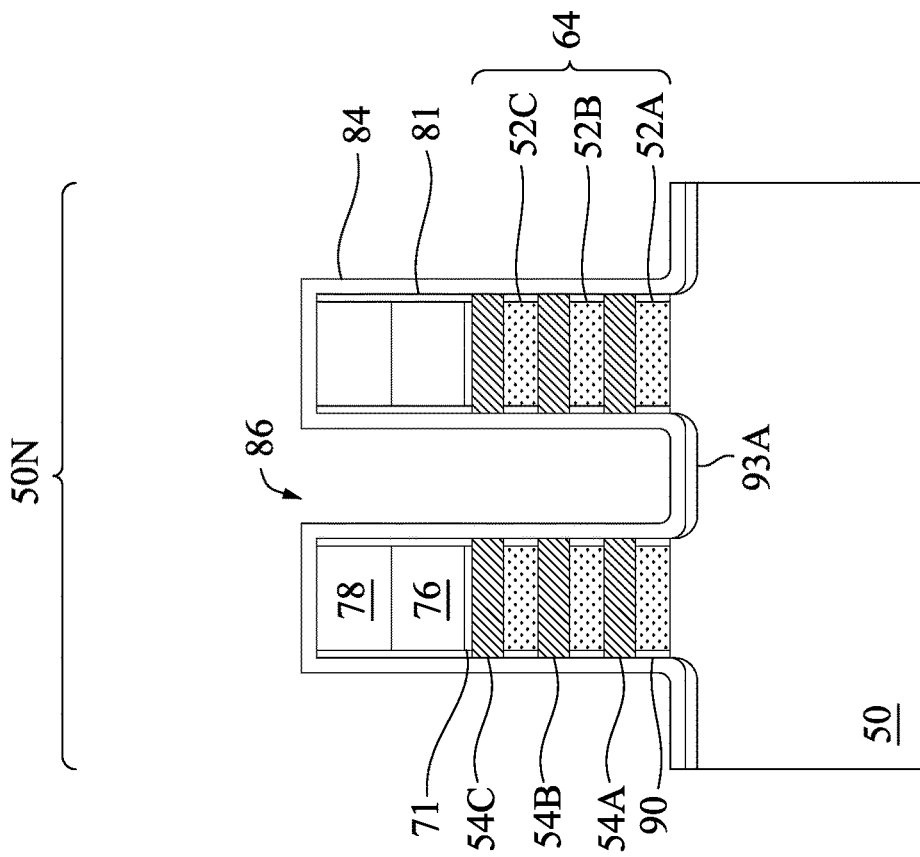

In FIG. 15, an etching process is applied to remove the mask layer 84 in the p-type region 50P. The etching process may be a wet etching process using an appropriate etchant such as diluted hydrogen fluoride (dHF) or the like. As a result of the etching process, sidewalls of the multilayer stack 64 and top surfaces of the first epitaxy regions 92A are exposed in the p-type region 50P. However, remaining portions of the mask layer 84 may cover the multilayer stack 64, the first epitaxy regions 93A, and the dummy gates 76 in the n-type region 50N. As a result of the etching process, a metal residue 99 from the mask layer 84 may remain in the p-type region 50P (see FIGS. 17B and 17C). The metal residue 99 may be located, for example, over the first epitaxy regions 92A and along sidewalls of the STI regions 68. After the mask layer 84 is patterned, the photoresist 85 may be removed using cleaning and/or ashing processes, for example. The resulting structure is illustrated in FIG. 16.

Figure 17A:
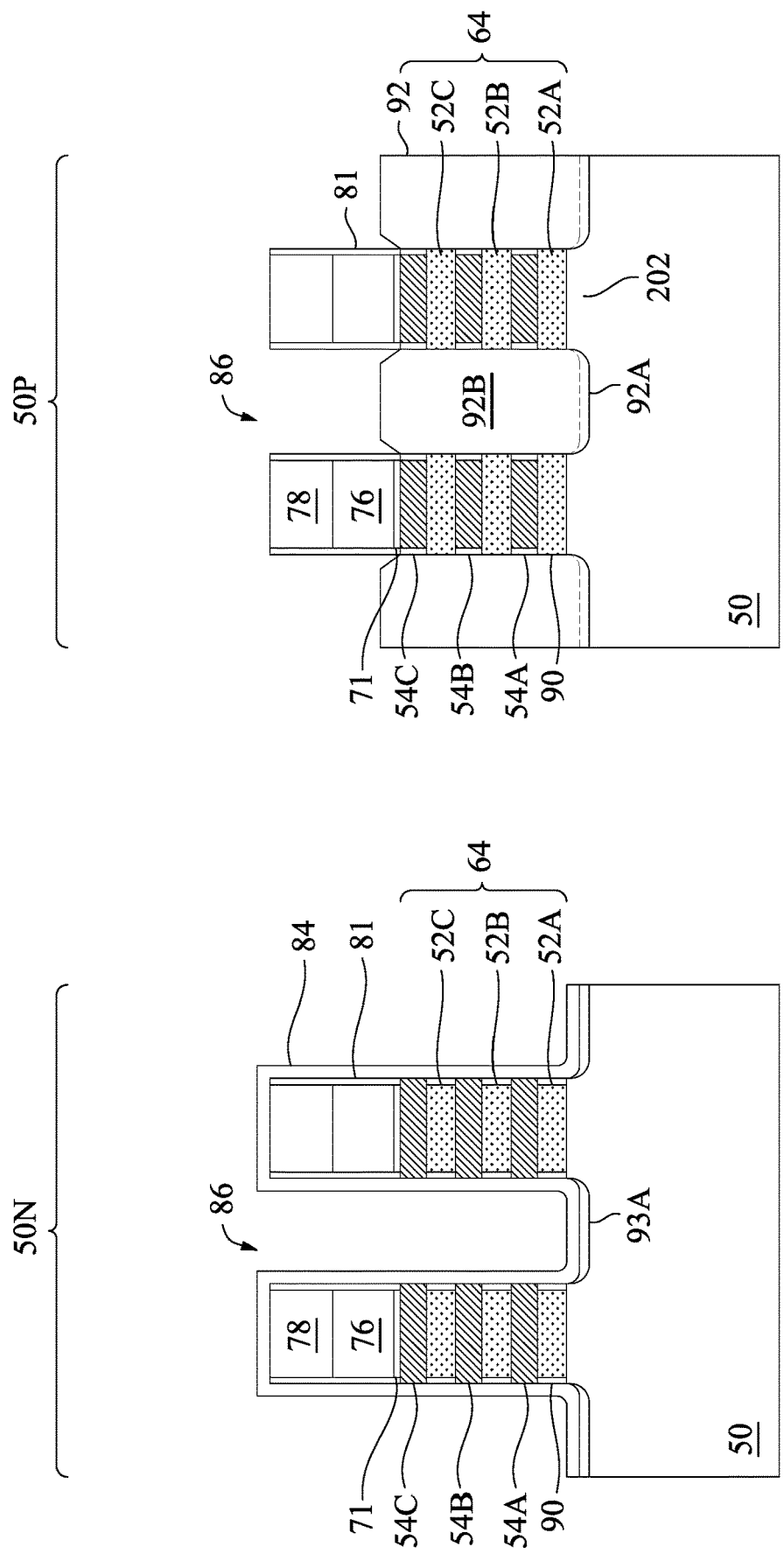
Figure 17C:
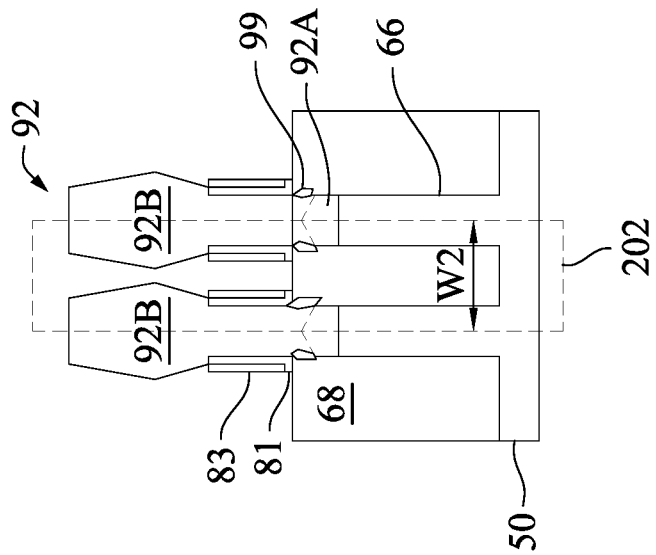
Figure 17B:
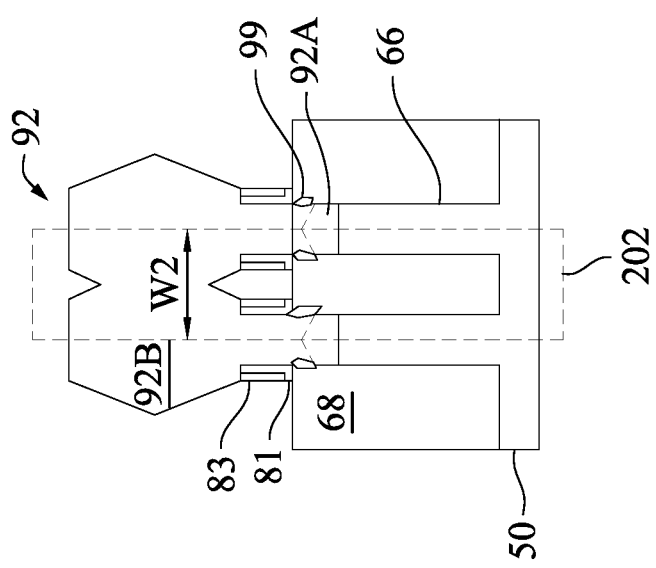

In FIGS. 17A-17C, remaining portions of epitaxial source/drain regions 92 are formed in the p-type region 50P. The epitaxial source/drain regions 92 may comprise one or more semiconductor material layers. For example, the epitaxial source/drain regions 92 may comprise a first epitaxy region 92A and a second epitaxy region 92B over the first epitaxy region 92A. The first semiconductor material layer 92A and the second semiconductor material layer 92B may be formed of different semiconductor materials and may be doped to different dopant concentrations. In some embodiments, the first semiconductor material layer 92A may have a dopant concentration less than the second semiconductor material layer 92B. Any number of semiconductor material layers may be used for the epitaxial source/drain regions 92. For example, in some embodiments, the epitaxial source/drain regions 92 may include additional epitaxy regions grown over the second epitaxy regions 92B. In such embodiments, the additional epitaxy regions may comprise a different material and/or have a different doping concentration than the first epitaxy regions 92A and/or the second epitaxy regions 92B.

In some embodiments, the second epitaxy regions 92B may exert stress and on the first nanostructures 52 in the p-type region 50P, thereby improving performance. As illustrated in FIG. 17, the second epitaxy regions 92B are formed in the first recesses 86 such that each dummy gate 76 is disposed between respective neighboring pairs of the second epitaxy regions 92. In some embodiments, the first spacers 81 are used to separate the second epitaxy regions 92B from the dummy gates 76 and the first inner spacers 90 are used to separate the second epitaxy regions 92B from the second nanostructures 54 by an appropriate lateral distance so that the epitaxial source/drain regions 92 do not short out with subsequently formed gates of the resulting nano-FETs.

The second epitaxy regions 92B may include any acceptable material appropriate for p-type nano-FETs. For example, if the first nanostructures 52 are silicon germanium, the second epitaxy regions 92B may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 64 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions 92 may have an impurity concentration of between about $1\times10^{19}$ atoms/cm$^3$ and about $1\times10^{21}$ atoms/cm$^3$. The p-type impurities for source/drain regions 92 may be any of the impurities previously discussed. In some embodiments, the epitaxial source/drain regions 92 may be in situ doped during growth. In embodiments where the epitaxial source/drain regions 92 include additional layers over the second epitaxy regions 92B, doping concentrations of these additional layers may be different than (e.g., less than) the second epitaxy regions 92B.

Illustrated in FIGS. 17B and 17C, as a result of the epitaxy processes used to form the epitaxial source/drain regions 92, upper surfaces of the epitaxial source/drain regions 92 have facets which expand laterally outward beyond sidewalls of the nanostructures 55. In some embodiments, these facets cause adjacent epitaxial source/drain regions 92 of a same NSFET to merge as illustrated by FIG. 17B. In other embodiments, adjacent source/drain regions 92 remain separated after the epitaxy process is completed as illustrated by FIG. 17C. In the embodiments illustrated in FIGS. 17B and 17C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The mask layer 84 covers the n-type region 50N while the second epitaxy regions 92B are grown. Because the mask layer 84 comprises a metal, advantages may be achieved. For example, during the epitaxial growth of the second epitaxy regions 92B, a hydrogen-comprising precursor (e.g., $SiH_4$, $Si_2H_6$, $SiH_2Cl_2$, or the like) may be flowed into the deposition chamber in the recesses 86 and over the mask layer 84. In embodiments where the mask layer 84 comprises aluminum oxide, the hydrogen component of the precursor may form a relatively high energy bond with oxygen atoms of the mask layer 84. As a result, the precursor may remain on surfaces of the mask layer 84, absorption of the precursor into the mask layer 84 may be reduced, and undesirable precursor residue (e.g., nodule defects) may be more easily removed with the mask layer 84. By removing precursor residue, a process window for subsequent epitaxial growth (e.g., epitaxial source/drain regions 93, see FIG. 23A) in the n-type regions 50N can be advantageously increased.

Further as illustrated by FIGS. 17B and 17C, the deposition and removal of the mask layer 84 may result in a metal residue 99 over the first epitaxy regions 92A and sidewalls of the STI regions 68. When the second epitaxy regions 92B are formed over the first epitaxy regions 92A, the residue 99 may be disposed between the first epitaxy regions 92A and the second epitaxy regions 92B along bottom corners of the second epitaxy regions 92B. The residue 99 may be further be disposed between the epitaxial source/drain regions 92 and the STI regions 68. In some embodiments, the metal residue 99 may improve bottom-up growth of the second epitaxy regions 92B by constraining epitaxial growth along the <100> plane. In some embodiments, a concentration of the metal element of metal residue 99 (e.g., aluminum, hafnium, or the like) in a region 202 may be greater than about $10^{19}$ at/cm$^3$. The region 202 may refer to a region having a width W2 and having lateral boundaries that extend through adjacent fins 66. In some embodiments, the width W2 may be in a range of about 10 nm to about 100 nm.

Figure 18:
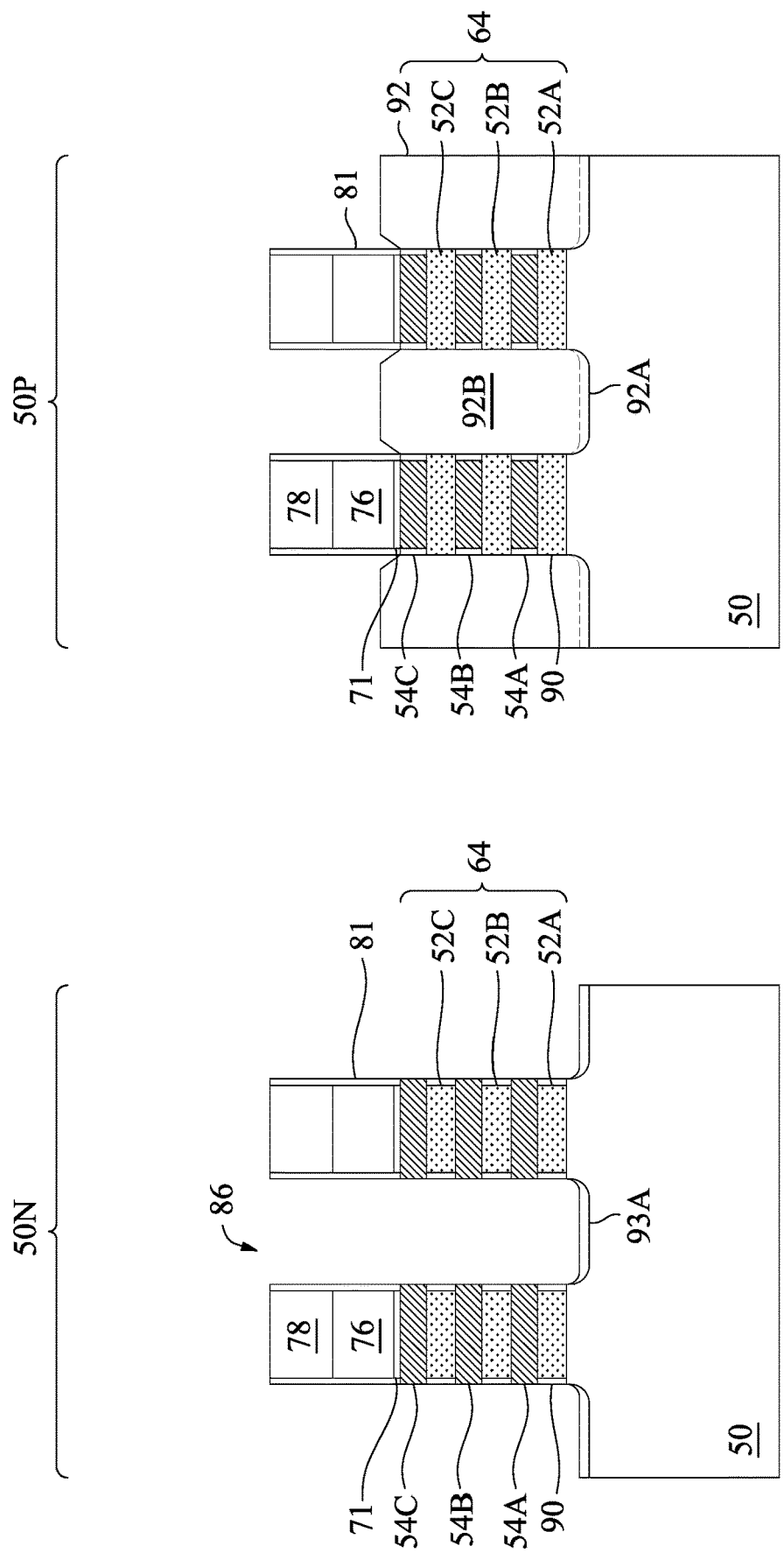

In FIG. 18, the mask 84 is removed from the n-type region 50N by, for example, an etching process. The etching process may be a wet etch that uses dHF acid, $H_2SO_4$, $NH_4OH$, $H_2O_2$, combinations thereof, or the like as an etchant. Because precursors flowed during the growth of the second epitaxy regions 92B remain bonded to surfaces of the mask 84, the etching process may readily remove residue precursor with the mask 84. As a result, precursor residue in the completed device may be reduced, and the process window for forming epitaxial source/drain regions in the n-type region 50N may be increased.

Figure 19:
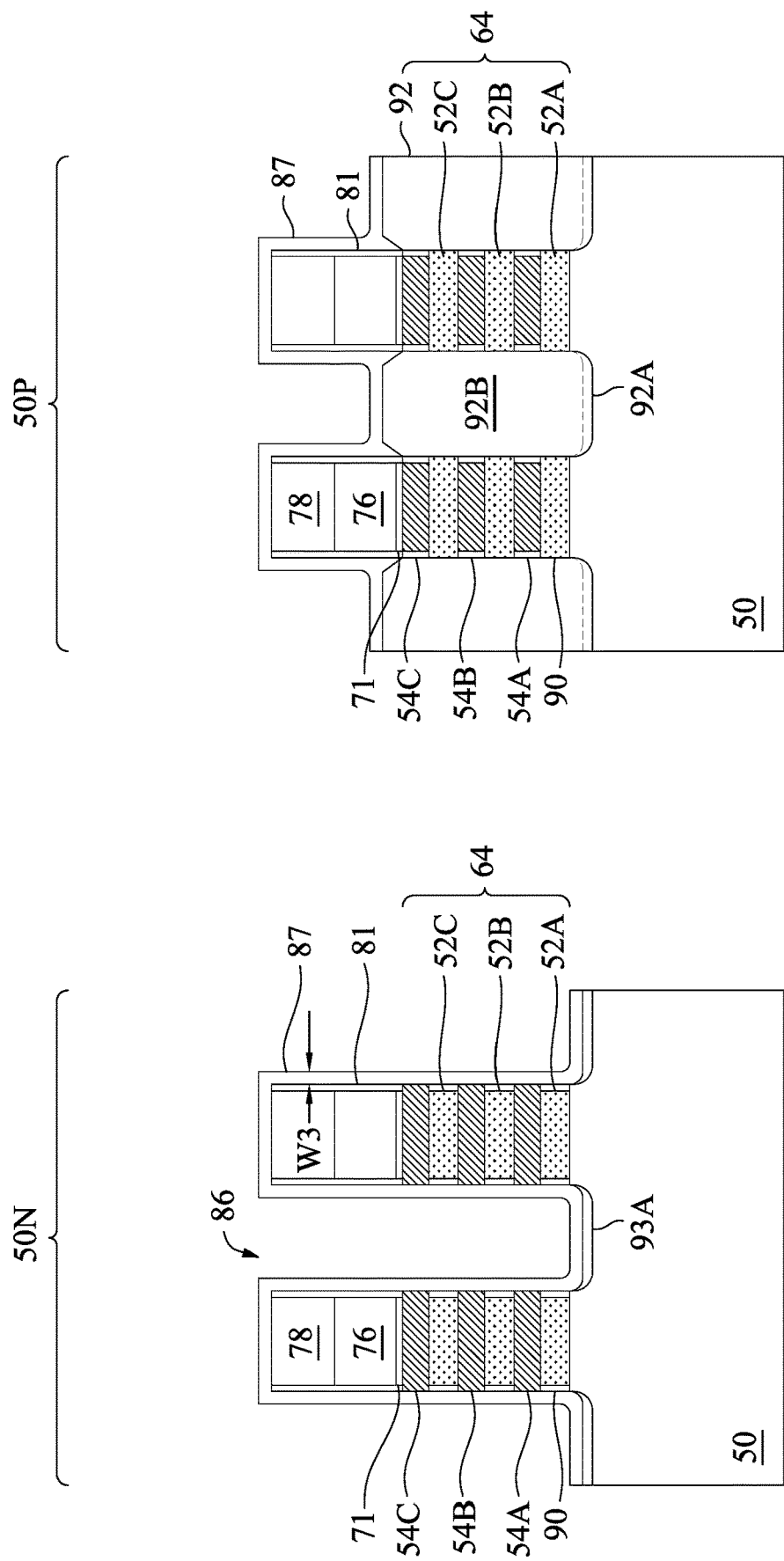

In FIG. 19, a mask layer 87 is deposited in the n-type region 50N and p-type region 50P. The mask layer 84 may be a conformal layer that is deposited along sidewalls and a bottom surface of the recesses 86 in the n-type regions 50N (e.g., along sidewalls of the first nanostructures 52, the second nanostructures 54, and the inner spacers 90 and along an upper surface of the first epitaxy regions 93A). The mask layer 84 may be further be deposited to cover top surfaces and sidewalls of the masks 78, the dummy gates 76, and the dummy gate dielectrics 71 as well as top surfaces of the epitaxial source/drain regions 92 in the p-type region 50P. The mask layer 87 may be formed a similar material and of a similar process as the mask layer 84. For example, in some embodiments, the mask layer 87 may be a metal-comprising mask layer and comprise, aluminum oxide, aluminum nitride, hafnium oxide, or the like. The mask layer 87 may have a width W1 in a range of about 1 nm to about 5 nm.

Figure 20:
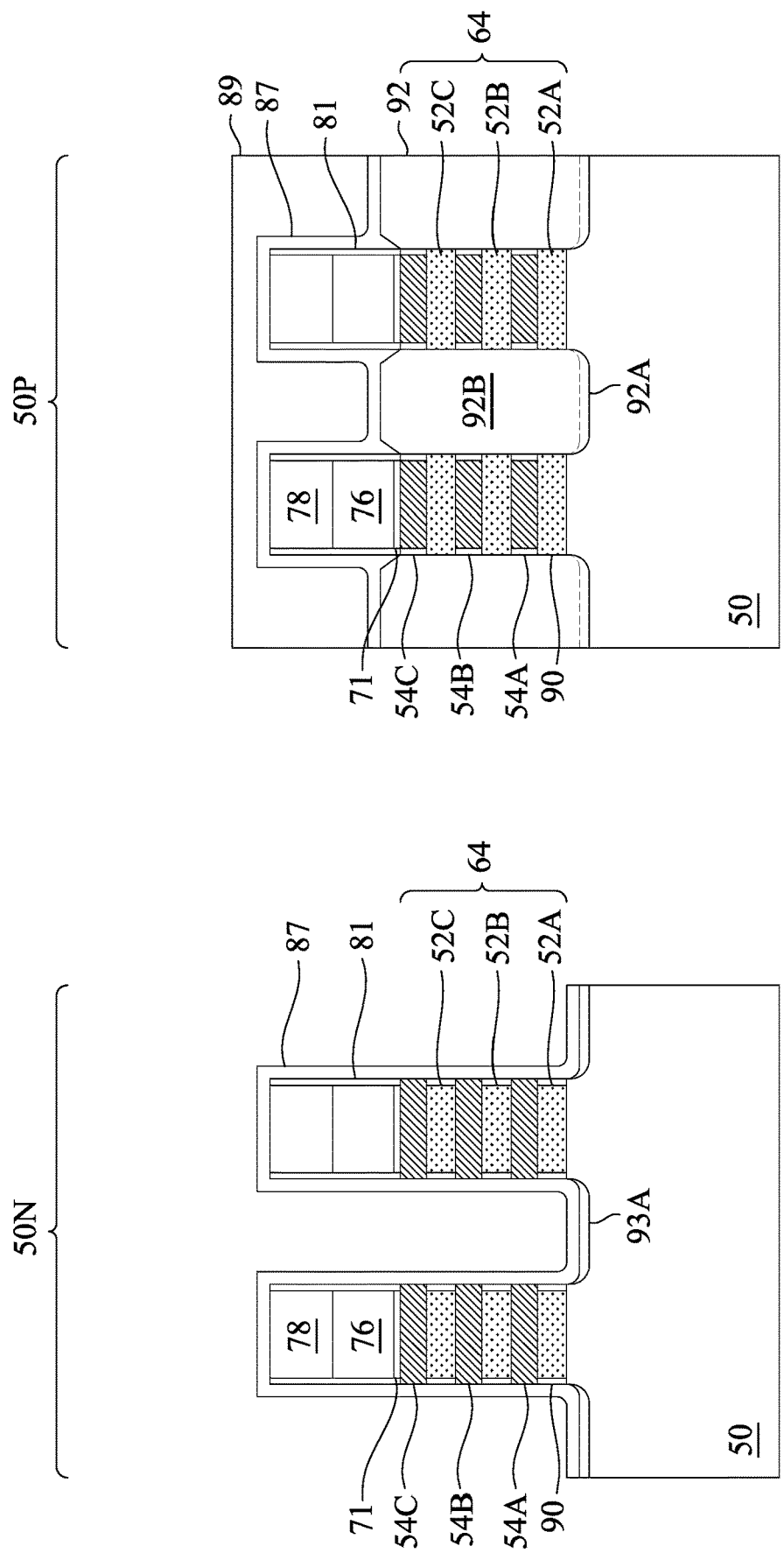

In FIG. 20, a photoresist 89 is deposited and patterned. The photoresist 89 can be formed by using a spin-on technique, for example, and can be patterned using acceptable photolithography techniques. The photoresist 89 be patterned to expose the n-type region 50N while covering the p-type region 50P. Although the photoresist 89 is illustrated as a single, it should be understood that the photoresist 89 may have a multilayer structure. In some embodiments, the photoresist 89 may be or comprise a BARC material.

Figure 21:
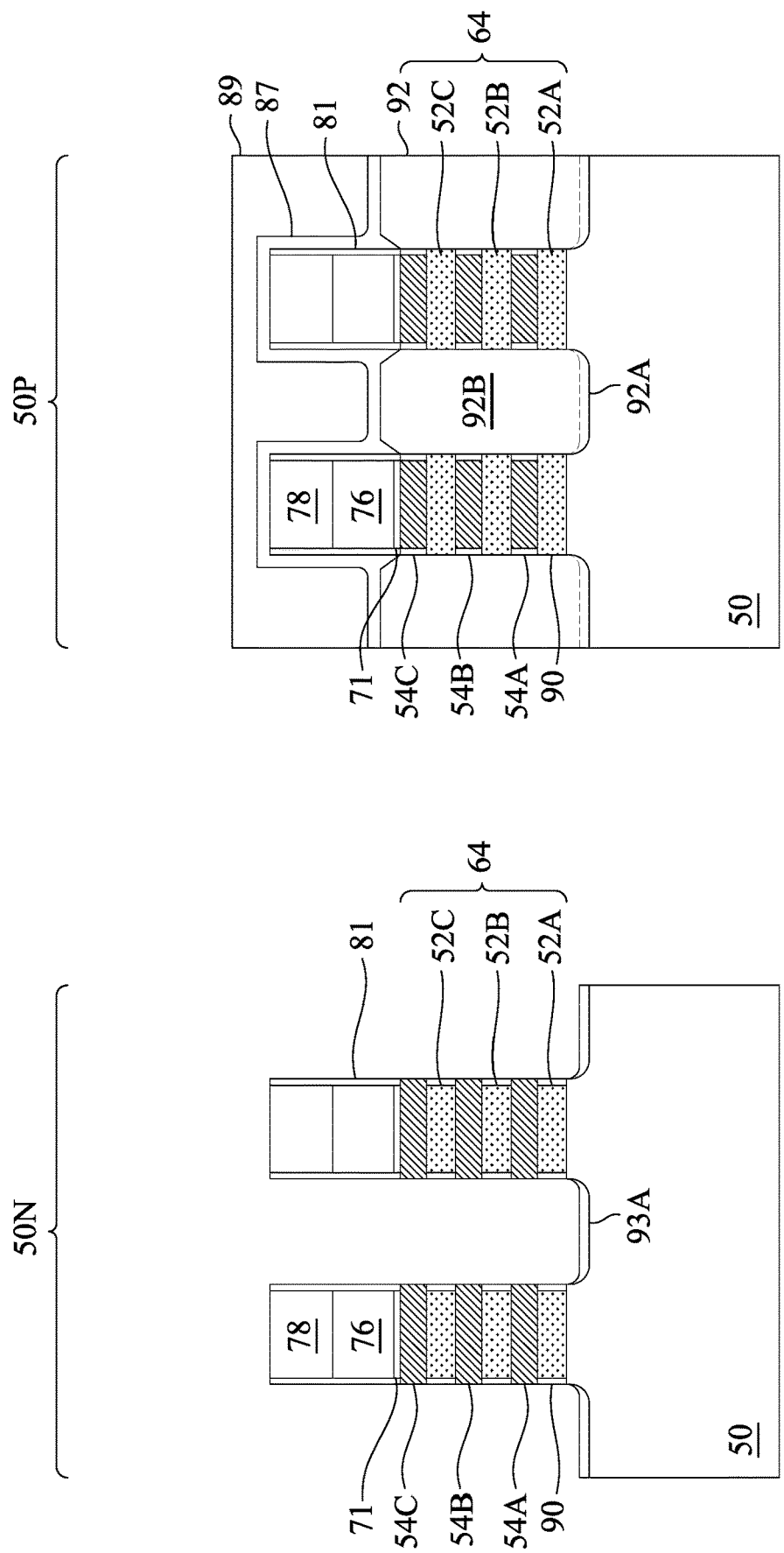
Figure 22:
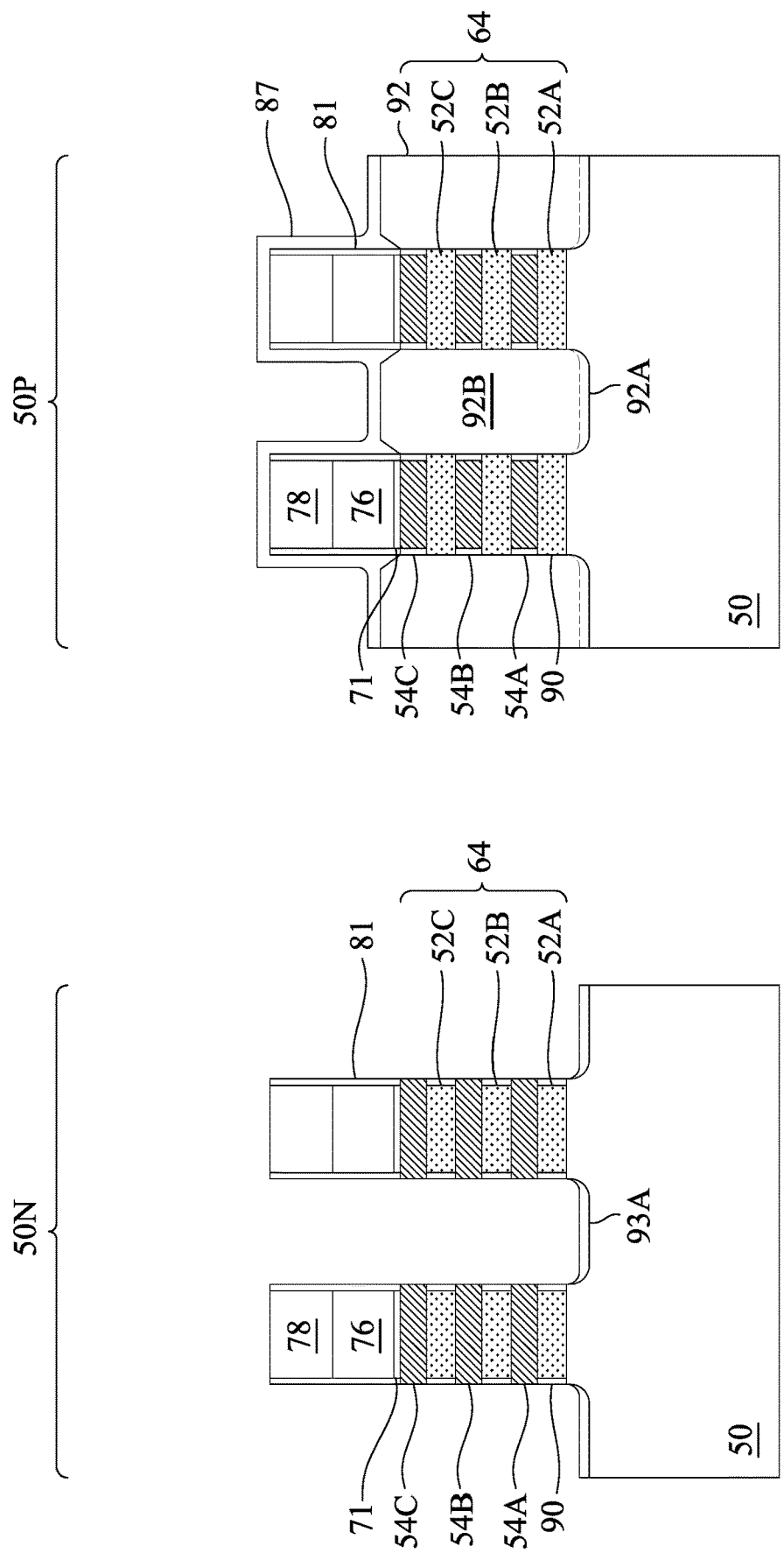

In FIG. 21, an etching process is applied to remove the mask layer 87 in the n-type region 50N. The etching process may be a wet etching process using an appropriate etchant such as dHF acid or the like. As a result of the etching process, sidewalls of the multilayer stack 64 and top surfaces of the first epitaxy regions 93A are exposed in the n-type region 50N. However, remaining portions of the mask layer 87 may cover the multilayer stack 64, the epitaxial source/drain regions 92, and the dummy gates 76 in the p-type region 50P. As a result of the etching process, a metal residue 101 from the mask layer 87 may remain in the n-type region 50N (see e.g., FIGS. 23B and 23C). The metal residue 101 may be located, for example, on top surfaces of the first epitaxy regions 93A and/or sidewalls of the STI regions 68. After the mask layer 87 is patterned, the photoresist 89 may be removed using cleaning and/or ashing processes, for example. The resulting structure is illustrated in FIG. 22.

Figure 23A:
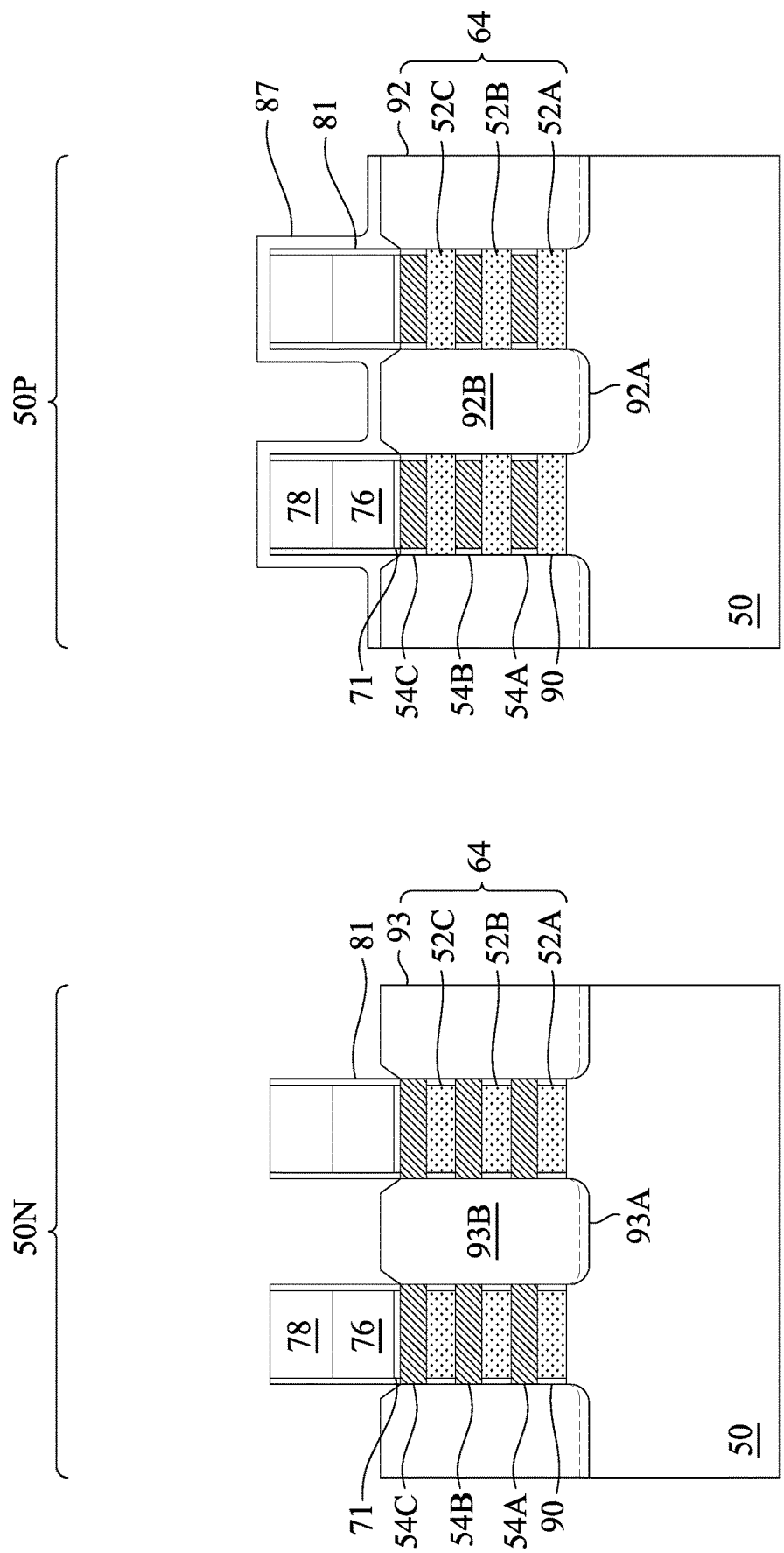
Figure 23C:
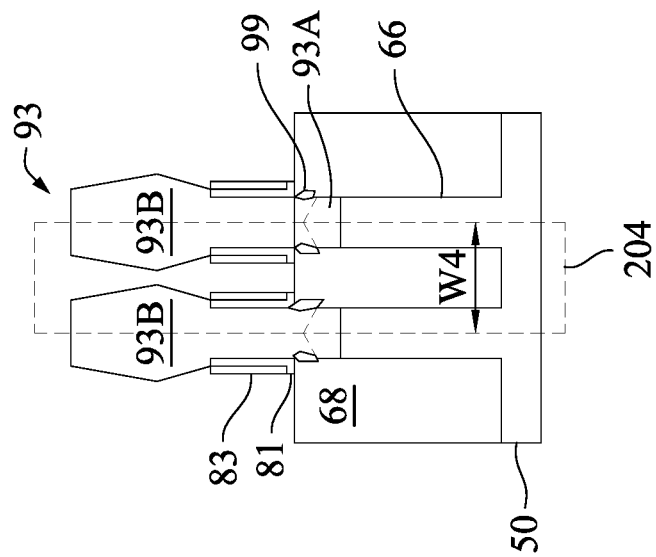
Figure 23B:
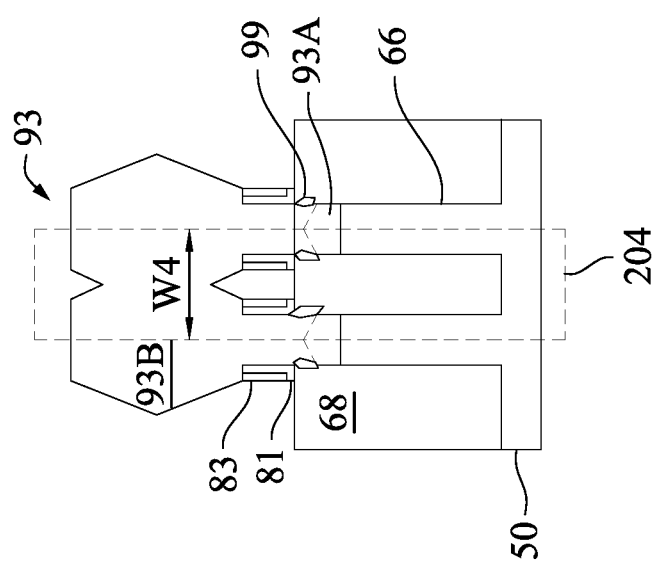

In FIGS. 23A-23C, remaining portions of epitaxial source/drain regions 93 are formed in the n-type region 50B. The epitaxial source/drain regions 93 may comprise one or more semiconductor material layers. For example, the epitaxial source/drain regions 92 may comprise a first epitaxy region 93A and a second epitaxy region 93B over the first epitaxy region 93A. The first semiconductor material layer 93A and the second semiconductor material layer 93B may be formed of different semiconductor materials and may be doped to different dopant concentrations. In some embodiments, the first semiconductor material layer 93A may have a dopant concentration less than the second semiconductor material layer 93B. Any number of semiconductor material layers may be used for the epitaxial source/drain regions 93. For example, in some embodiments, the epitaxial source/drain regions 93 may include additional epitaxy regions grown over the second epitaxy regions 93B. In such embodiments, the additional epitaxy regions may comprise a different material and/or have a different doping concentration than the first epitaxy regions 93A and/or the second epitaxy regions 93B.

In some embodiments, the second epitaxy regions 93B may exert stress and on the second nanostructures 54 in the n-type region 50N, thereby improving performance. The second epitaxy regions 92B are formed in the first recesses 86 such that each dummy gate 76 is disposed between respective neighboring pairs of the second epitaxy regions 92. In some embodiments, the first spacers 81 are used to separate the second epitaxy regions 92B from the dummy gates 76 and the first inner spacers 90 are used to separate the second epitaxy regions 92B from the first nanostructures 52 by an appropriate lateral distance so that the epitaxial source/drain regions 92 do not short out with subsequently formed gates of the resulting nano-FETs.

The second epitaxy regions 93B may include any acceptable material appropriate for n-type nano-FETs. For example, if the second nanostructures 54 are silicon, the second epitaxy regions 93B may comprise materials exerting a tensile strain on the second nanostructures 54, such as silicon, silicon carbide, phosphorous doped silicon carbide, silicon phosphide, or the like. The epitaxial source/drain regions 93 may also have surfaces raised from respective surfaces of the multi-layer stack 64 and may have facets.

The epitaxial source/drain regions 93, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions 93 may have an impurity concentration of between about $1\times10^{19}$ atoms/cm$^3$ and about $1\times10^{21}$ atoms/cm$^3$. The n-type impurities for source/drain regions 93 may be any of the impurities previously discussed. In some embodiments, the epitaxial source/drain regions 93 may be in situ doped during growth. In embodiments where the epitaxial source/drain regions 93 include additional layers over the second epitaxy regions 93B, doping concentrations of these additional layers may be different than (e.g., less than) the second epitaxy regions 93B.

Illustrated in FIGS. 23B and 23C, as a result of the epitaxy processes used to form the epitaxial source/drain regions 93, upper surfaces of the epitaxial source/drain regions 93 have facets which expand laterally outward beyond sidewalls of the nanostructures 55. In some embodiments, these facets cause adjacent epitaxial source/drain regions 93 of a same NSFET to merge as illustrated by FIG. 23B. In other embodiments, adjacent source/drain regions 93 remain separated after the epitaxy process is completed as illustrated by FIG. 23C. In the embodiments illustrated in FIGS. 23B and 23C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth.

The mask layer 87 covers the 9-type region 50P while the second epitaxy regions 93B are grown. Because the mask layer 87 comprises a metal, advantages may be achieved. For example, during the epitaxial growth of the second epitaxy regions 93B, a hydrogen-comprising precursor (e.g., SiH$_4$, Si$_2$H$_6$, SiH$_2$C$_2$, or the like) may be flowed into the deposition chamber in the recesses 86 and over the mask layer 87. In embodiments where the mask layer 87 comprises aluminum oxide, the hydrogen component of the precursor may form a relatively high energy bond with oxygen atoms of the mask layer 87. As a result, the precursor may remain on surfaces of the mask layer 87, absorption of the precursor into the mask layer 87 may be reduced, and undesirable precursor residue (e.g., nodule defects) may be more easily removed with the mask layer 87.

Further as illustrated by FIGS. 23B and 23C, the deposition and removal of the mask layer 87 may result in a metal residue to remain over the first epitaxy regions 93A and sidewalls of the STI regions 68. When the second epitaxy regions 92B are deposited over the first epitaxy regions 92A, the residue 101 may be disposed between the first epitaxy regions 93A and the second epitaxy regions 93B along bottom corners of the second epitaxy regions 93B. The residue 101 may further be disposed between the epitaxial source/drain regions 93 and the STI regions 68. In some embodiments, a concentration of the metal element of metal residue 101 (e.g., aluminum, hafnium, or the like) in a region 204 may be greater than about $10^{19}$ at/cm$^3$. The region 204 may refer to a region having a width W4 and having lateral boundaries that extend through adjacent fins 66. In some embodiments, the width W4 may be in a range of about 10 nm to about 100 nm.

Figure 24:
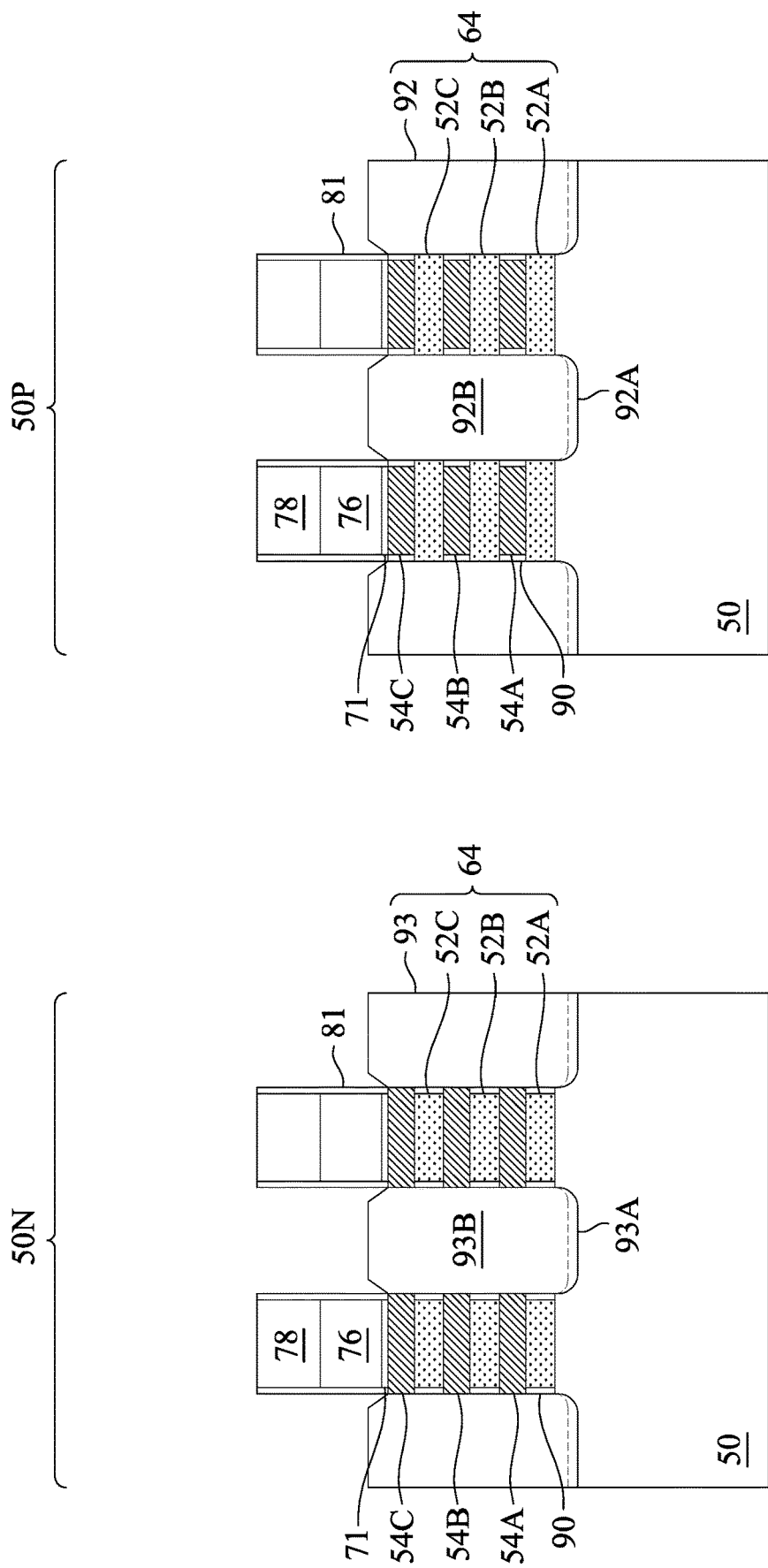

In FIG. 24, the mask 87 is removed from the n-type region 50N by, for example, an etching process. The etching process may be a wet etch that uses dHF acid, H$_2$SO$_4$, NH$_4$OH, H$_2$O$_2$, combinations thereof, or the like as an etchant. Because precursors flowed during the growth of the second epitaxy regions 93B remain bonded to surfaces of the mask 87, the etching process may readily remove residue precursor with the mask 87. As a result, precursor residue in the completed device may be reduced.

Accordingly, epitaxial source/drain regions 92 and 93 are formed in the p-type region 50P and the n-type region 50N, respectively. The above figures describe epitaxial source/drain regions 92 in the p-type region 50P being formed prior to the epitaxial source/drain regions 93 in the n-type region 50N for ease of discussion only. It should be appreciated that in other embodiments, epitaxial source/drain regions in the n-type region 50N may be formed prior to forming epitaxial source/drain regions in the p-type region 50P.

Figure 25A:
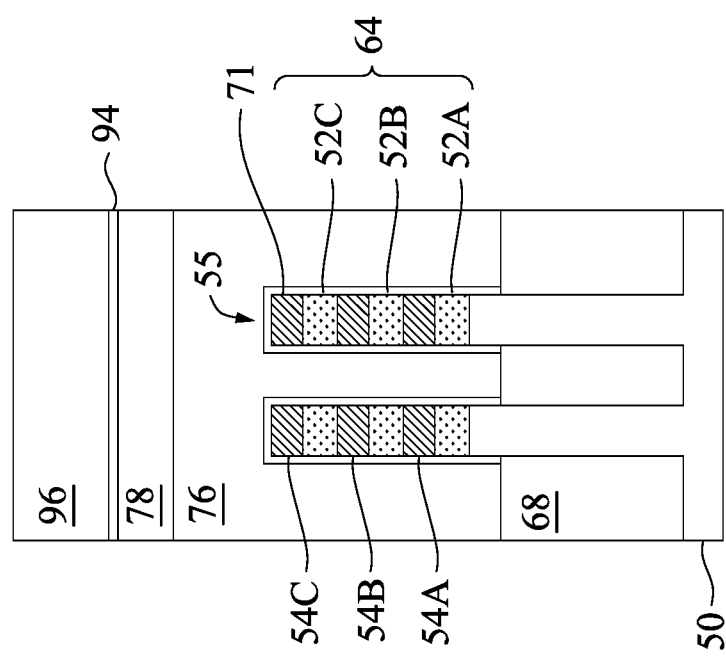
Figure 25B:
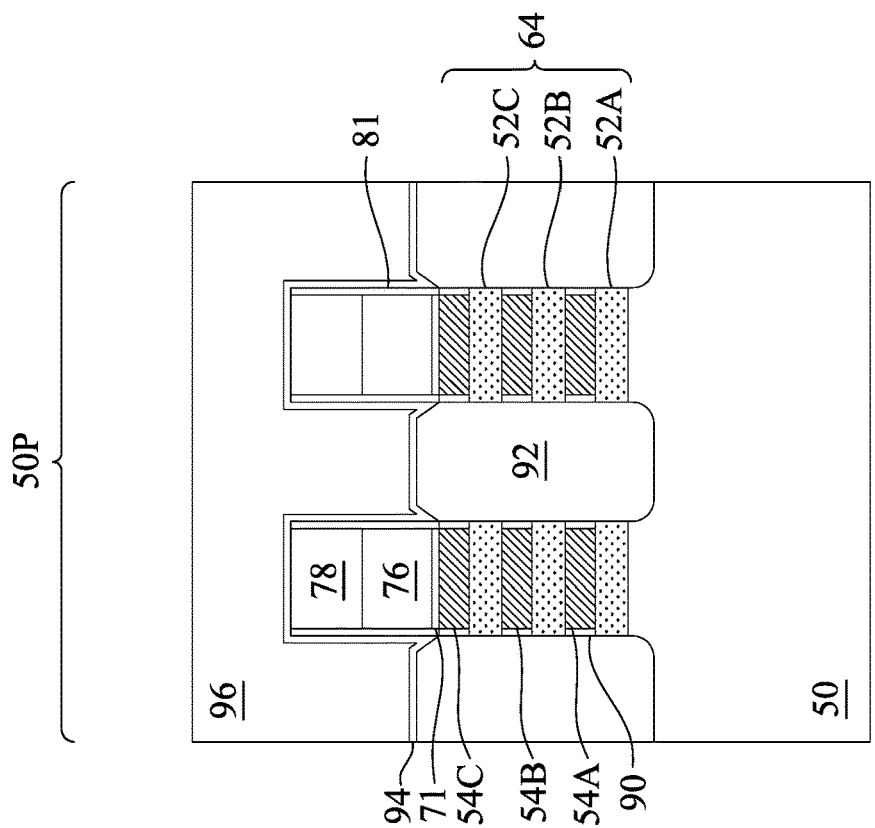
Figure 25B:
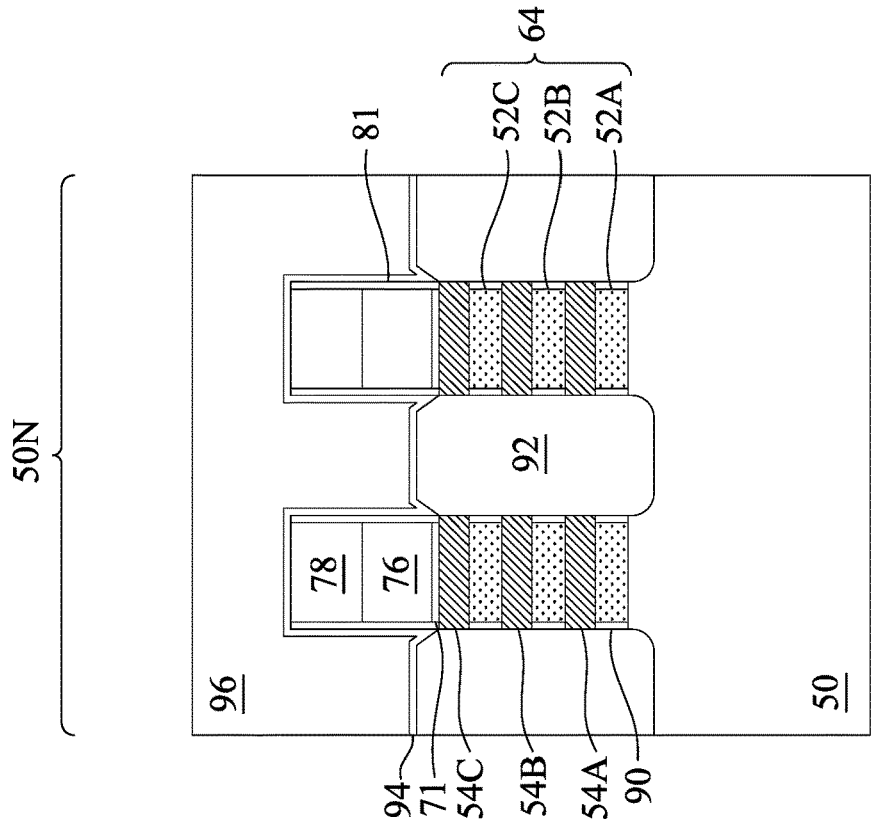
Figure 25C:
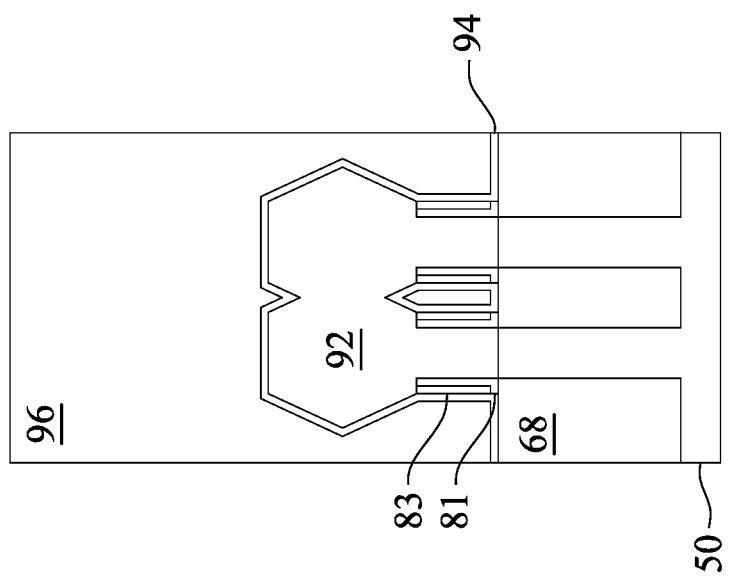

In FIGS. 25A-25C, a first interlayer dielectric (ILD) 96 is deposited over the structure illustrated in FIGS. 6A, 24B, and 24A (the processes of FIGS. 7A-24E do not alter the cross-section illustrated in FIG. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 74, and the first spacers 81. The CESL 94 may comprise a dielectric material, such as, silicon nitride, silicon oxide, silicon oxynitride, or the like, having a different etch rate than the material of the overlying first ILD 96.

Figure 26A:
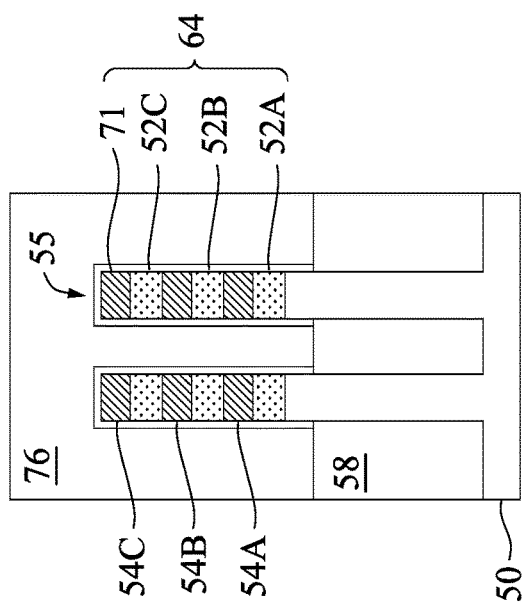
Figure 26B:
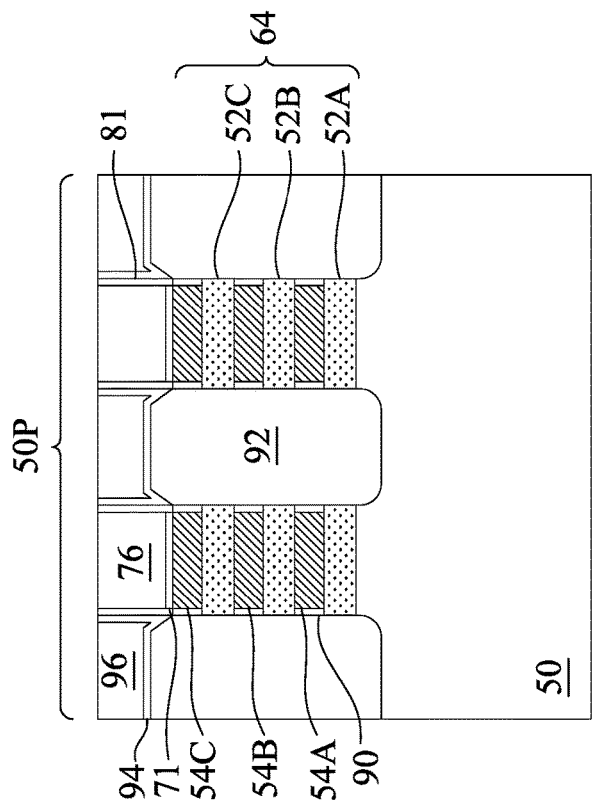
Figure 26B:
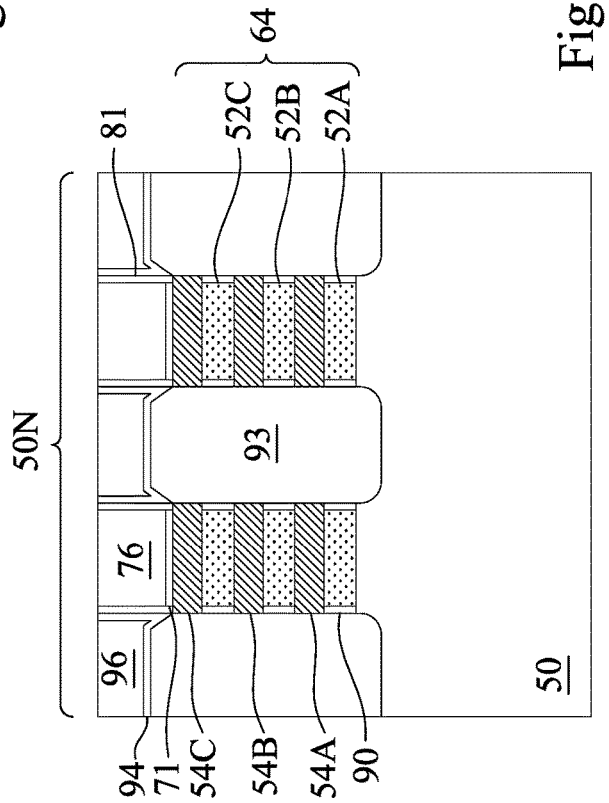

In FIGS. 26A-26C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 72 are exposed through the first ILD 96. In some embodiments, the masks 78 may remain, in which case the planarization process levels the top surface of the first ILD 96 with top surface of the masks 78 and the first spacers 81.

Figure 27A:
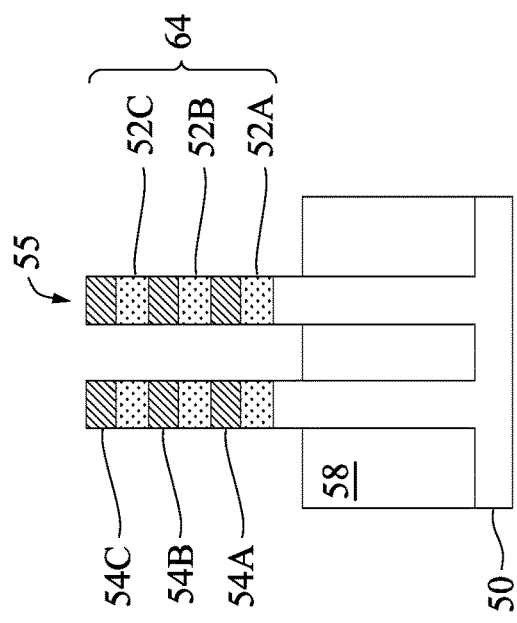
Figure 27B:
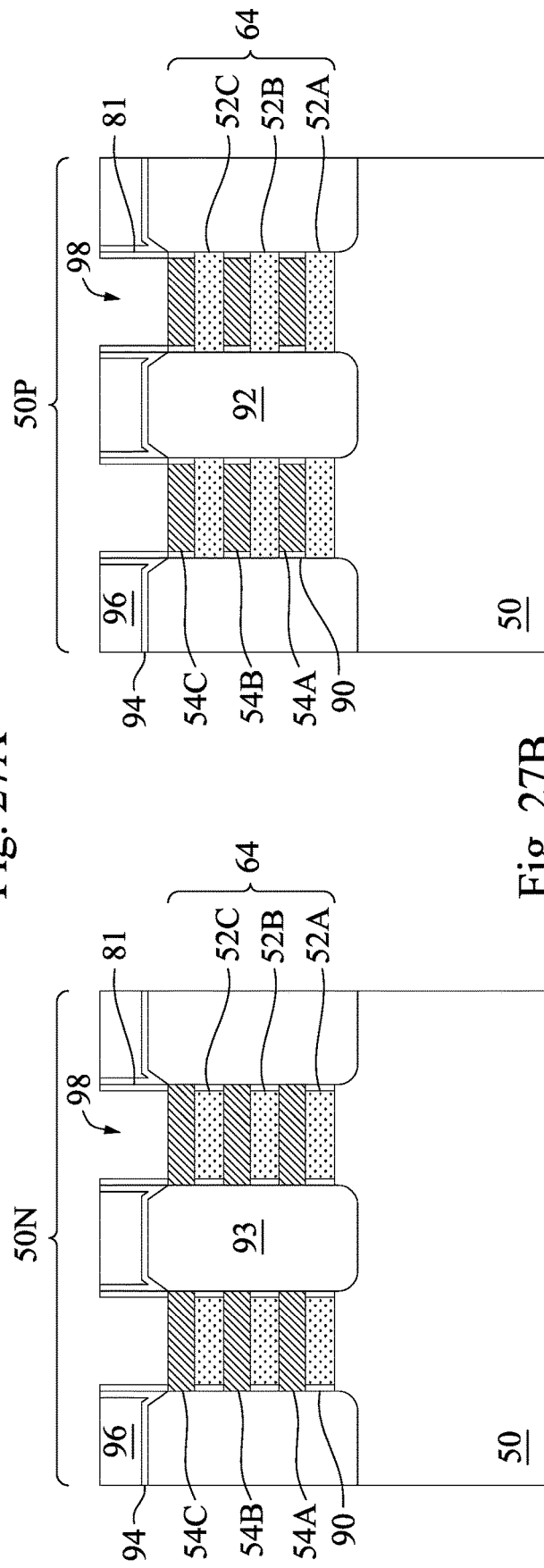

In FIGS. 27A and 27B, the dummy gates 72, and the masks 74 if present, are removed in one or more etching steps, so that second recesses 98 are formed. Portions of the dummy gate dielectrics 60 in the second recesses 98 are also be removed. In some embodiments, the dummy gates 72 and the dummy gate dielectrics 60 are removed by an anisotropic dry etch process. For example, the etching process may include a dry etch process using reaction gas(es) that selectively etch the dummy gates 72 at a faster rate than the first ILD 96 or the first spacers 81. Each second recess 98 exposes and/or overlies portions of nanostructures 55, which act as channel regions in subsequently completed nanoFETs. Portions of the nanostructures 55 which act as the channel regions are disposed between neighboring pairs of the epitaxial source/drain regions 92. During the removal, the dummy dielectric layers 60 may be used as etch stop layers when the dummy gates 72 are etched. The dummy dielectric layers 60 may then be removed after the removal of the dummy gates 72.

Figure 28A:
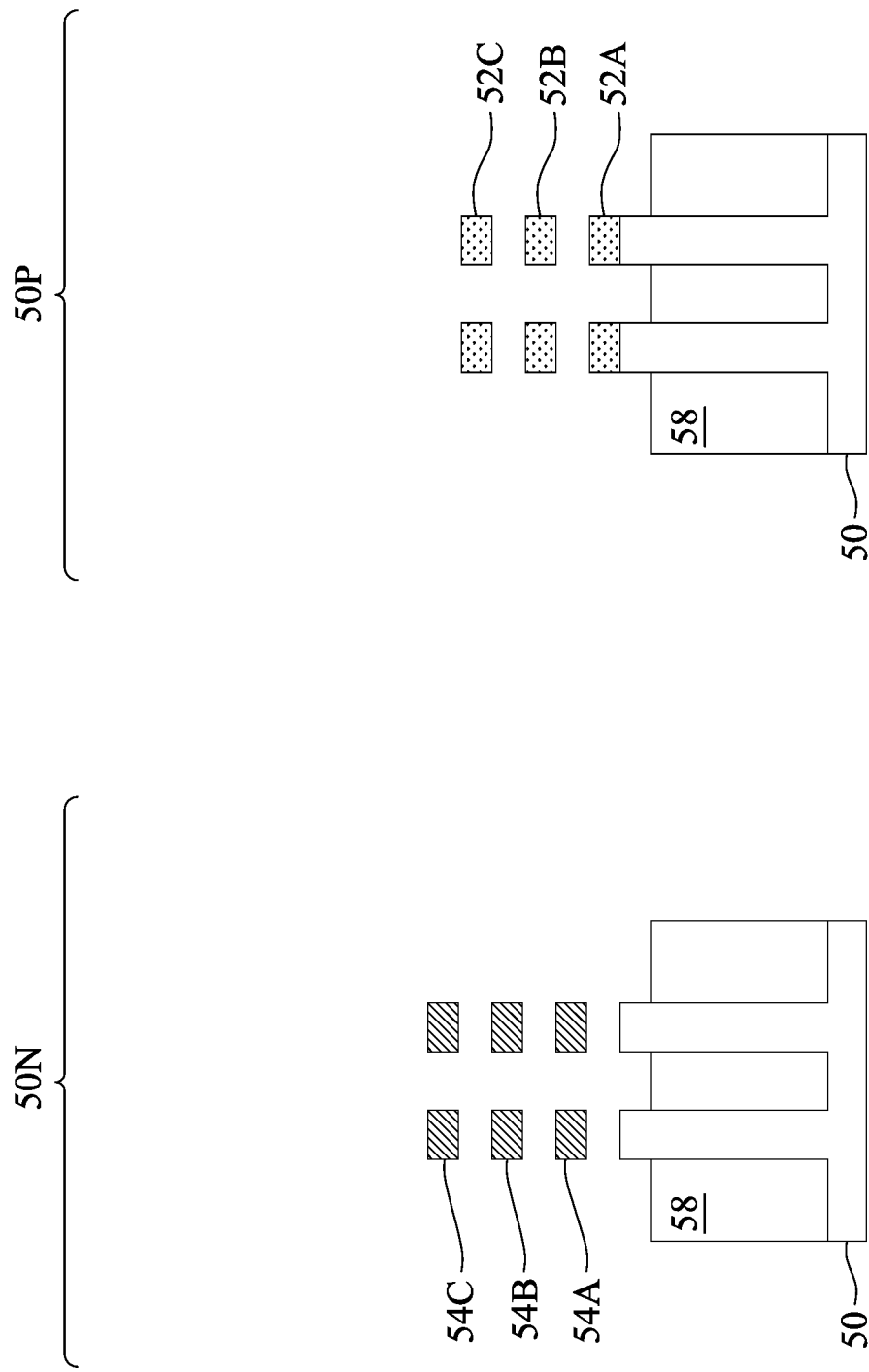
Figure 28B:
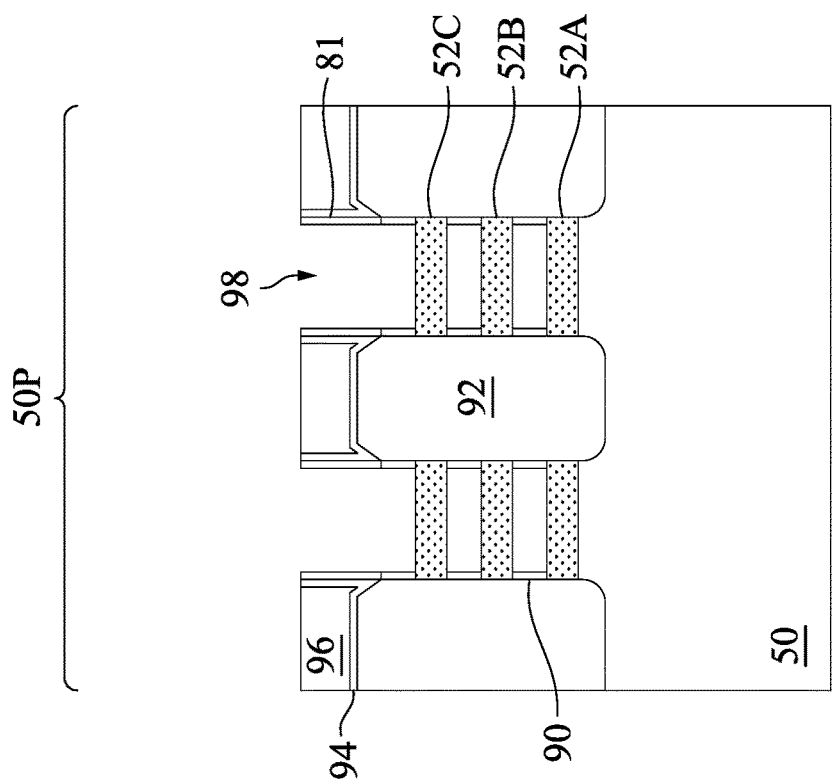
Figure 28B:
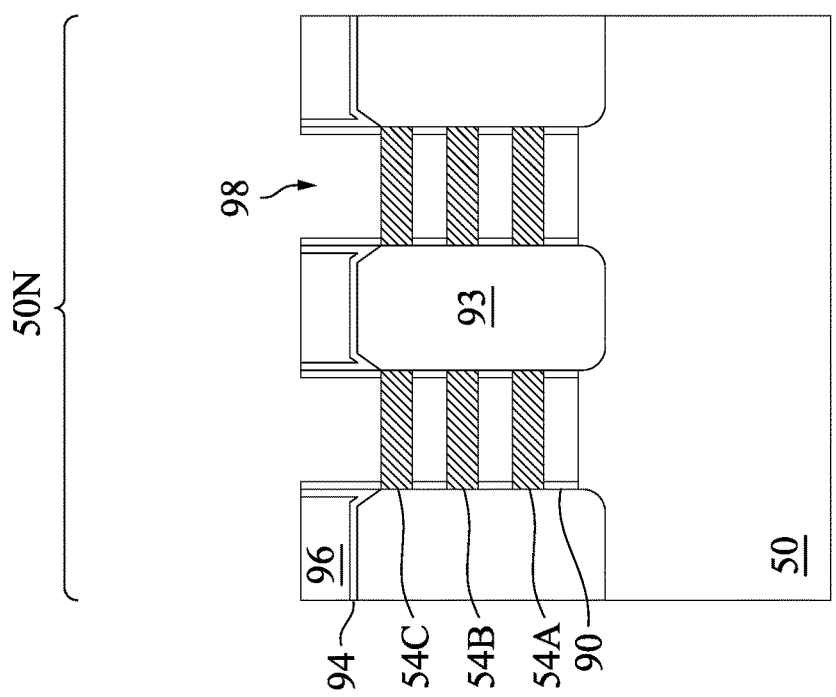

In FIGS. 28A and 28B, the first nanostructures 52 in the n-type region 50N and the second nanostructures 54 in the p-type region 50P are removed extending the second recesses 98. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 58 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide (NH$_4$OH), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 58 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

Figure 29A:
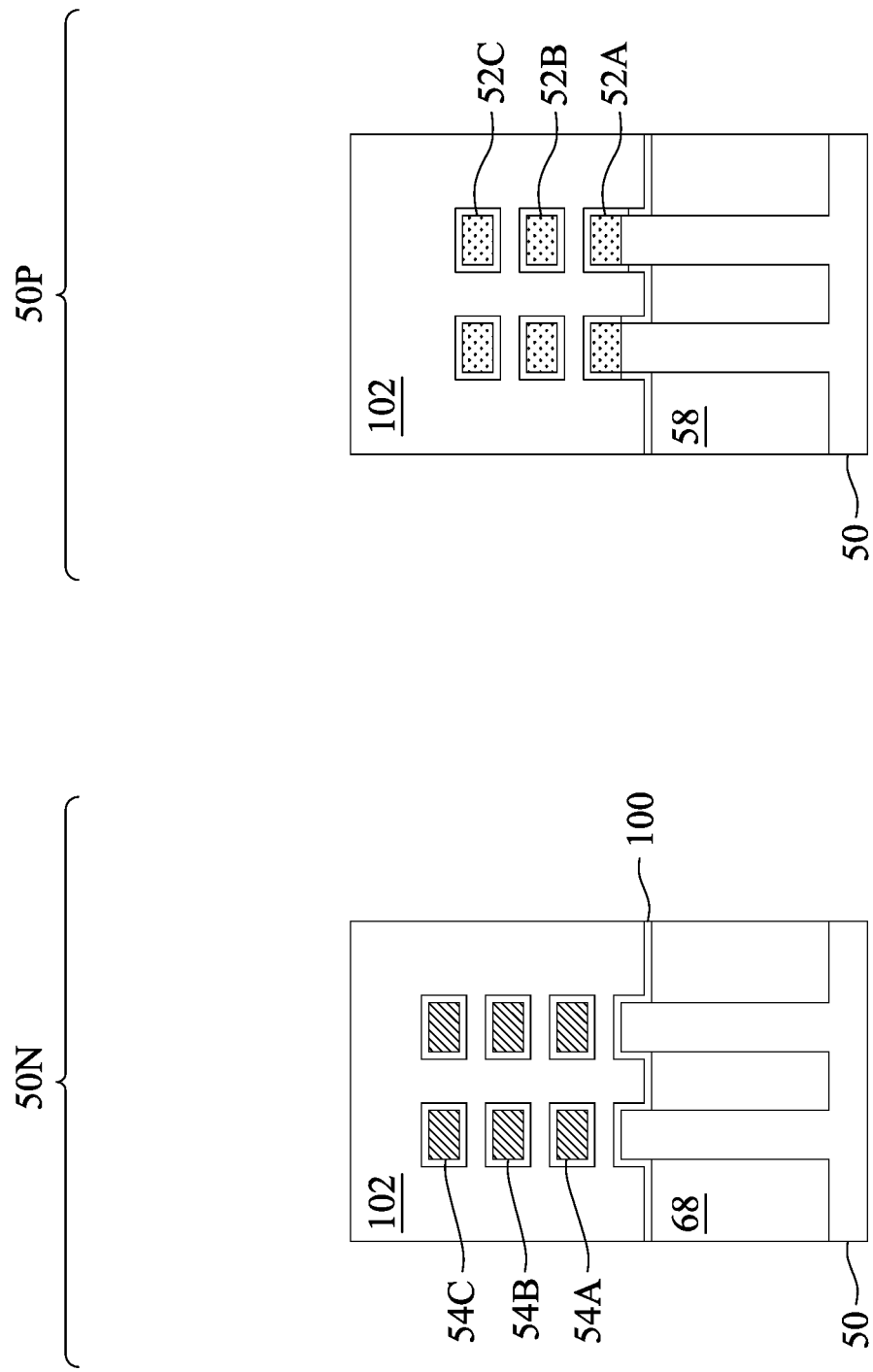
Figure 29B:
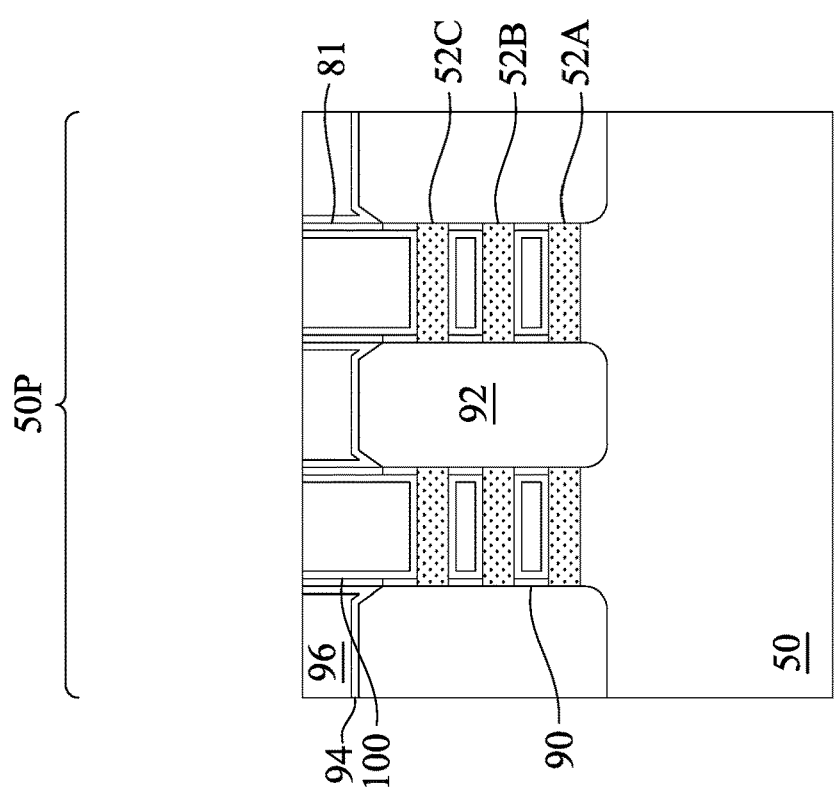
Figure 29B:
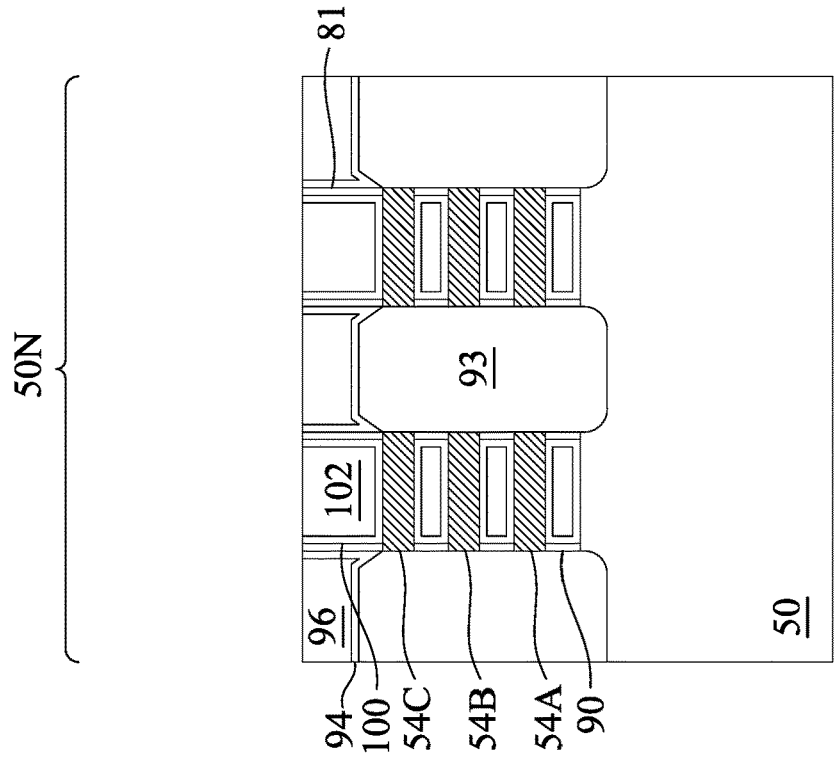

In FIGS. 29A and 29B, gate dielectric layers 100 and gate electrodes 102 are formed for replacement gates. The gate dielectric layers 100 are deposited conformally in the second recesses 98. In the n-type region 50N, the gate dielectric layers 100 may be formed on top surfaces and sidewalls of the substrate 50 and on top surfaces, sidewalls, and bottom surfaces of the second nanostructures 54, and in the p-type region 50P, the gate dielectric layers 100 may be formed on top surfaces and sidewalls of the substrate 50 and on top surfaces, sidewalls, and bottom surfaces of the first nanostructures 52. The gate dielectric layers 100 may also be deposited on top surfaces of the first ILD 96, the CESL 94, the first spacers 81, and the STI regions 58.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 17A and 17B, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 30A:
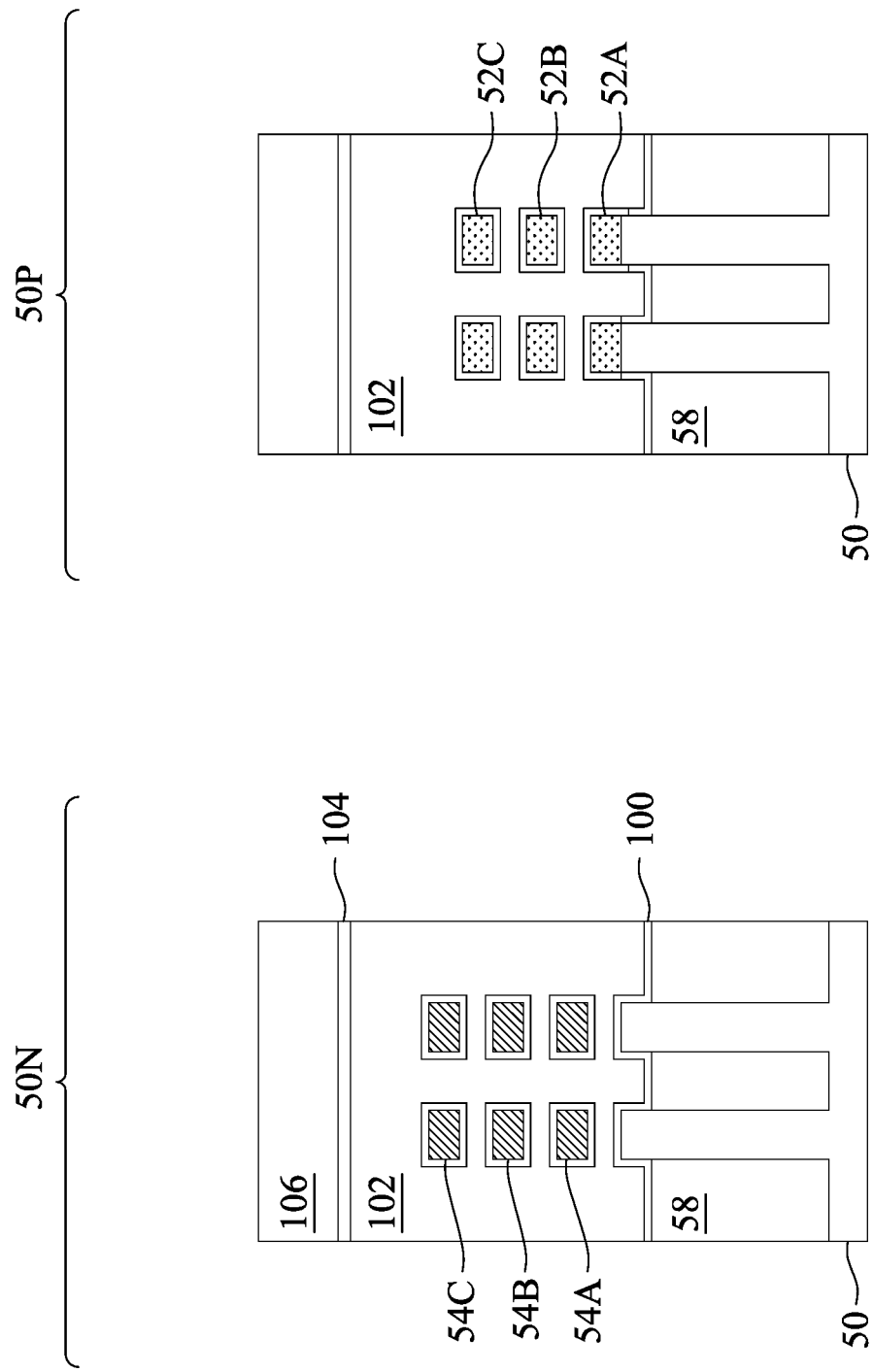
Figure 30B:
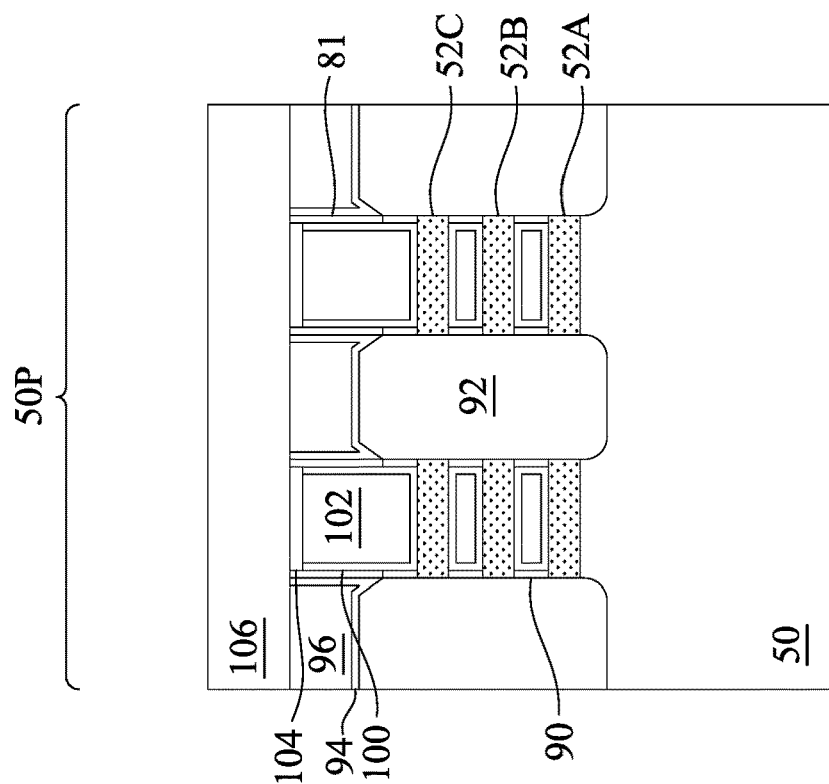
Figure 30B:
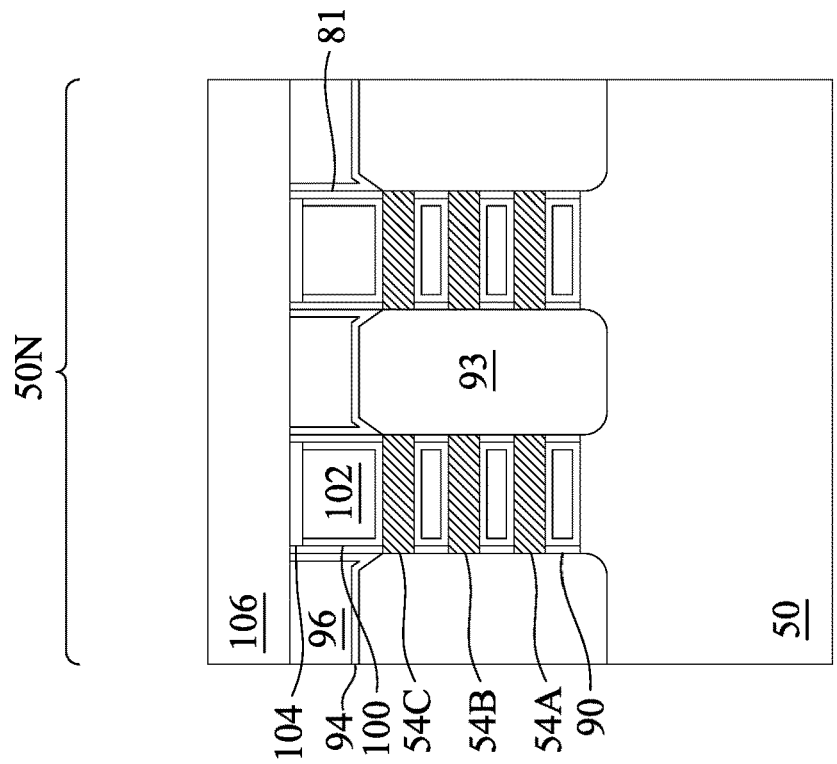
Figure 30C:
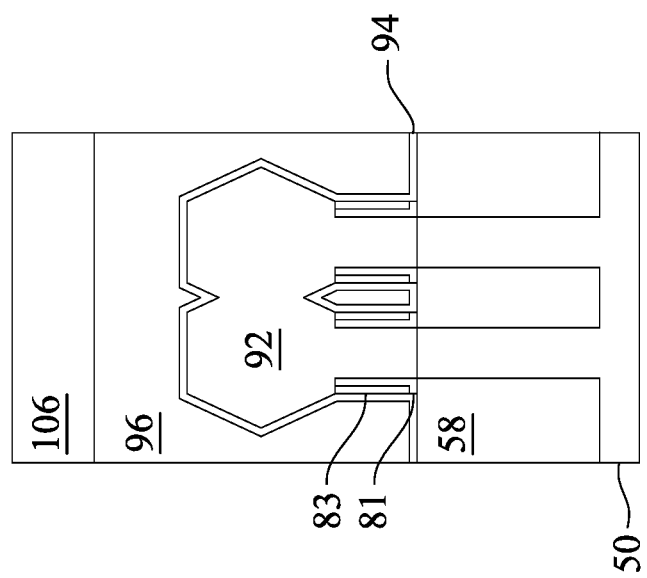

In FIGS. 30A-30C, the gate structure (including the gate dielectric layers 100 and the corresponding overlying gate electrodes 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 32A and 32B) penetrate through the gate mask 104 to contact the top surface of the recessed gate electrodes 102.

As further illustrated by FIGS. 30A-30C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 31A:
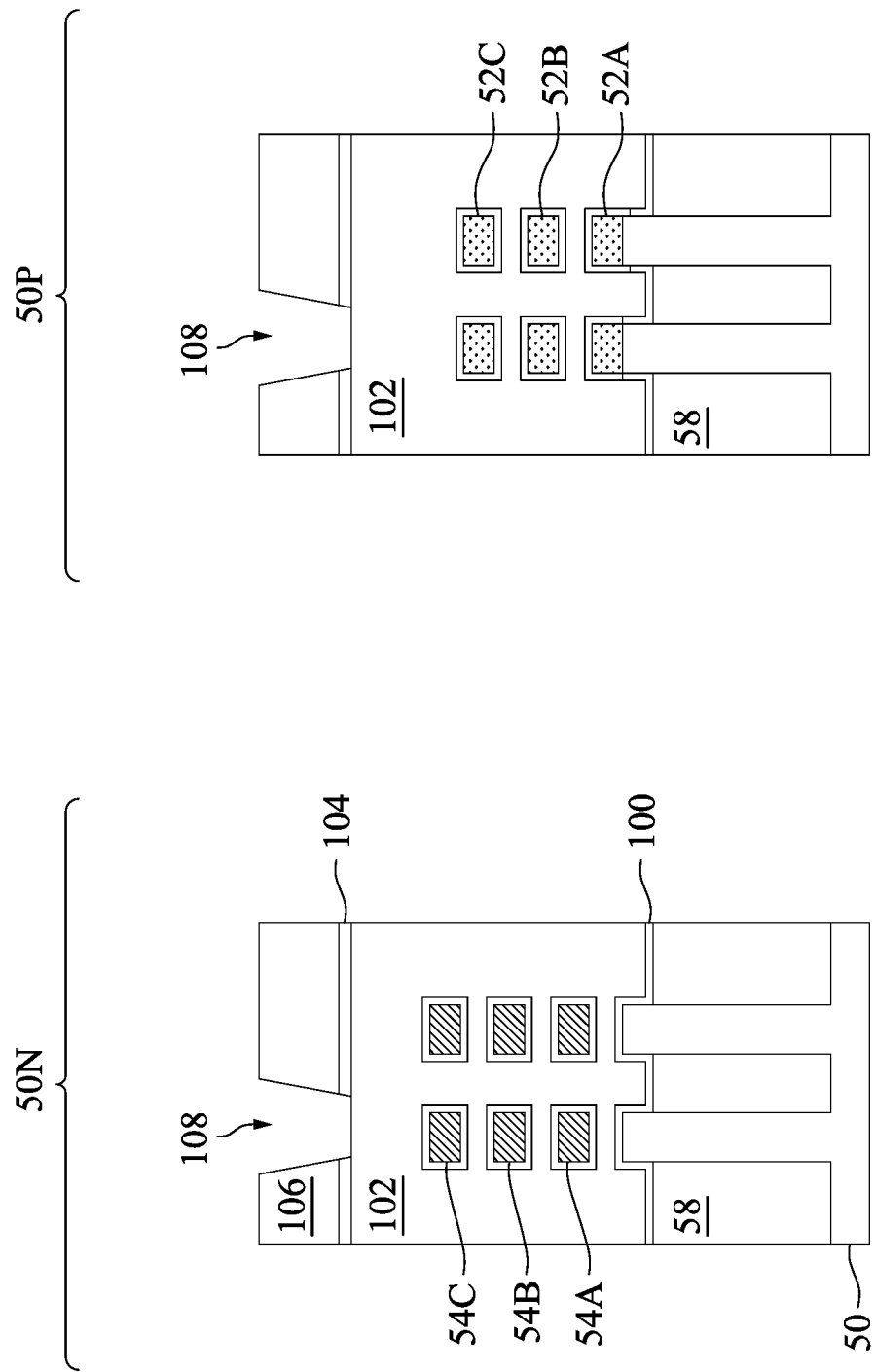
Figure 31B:
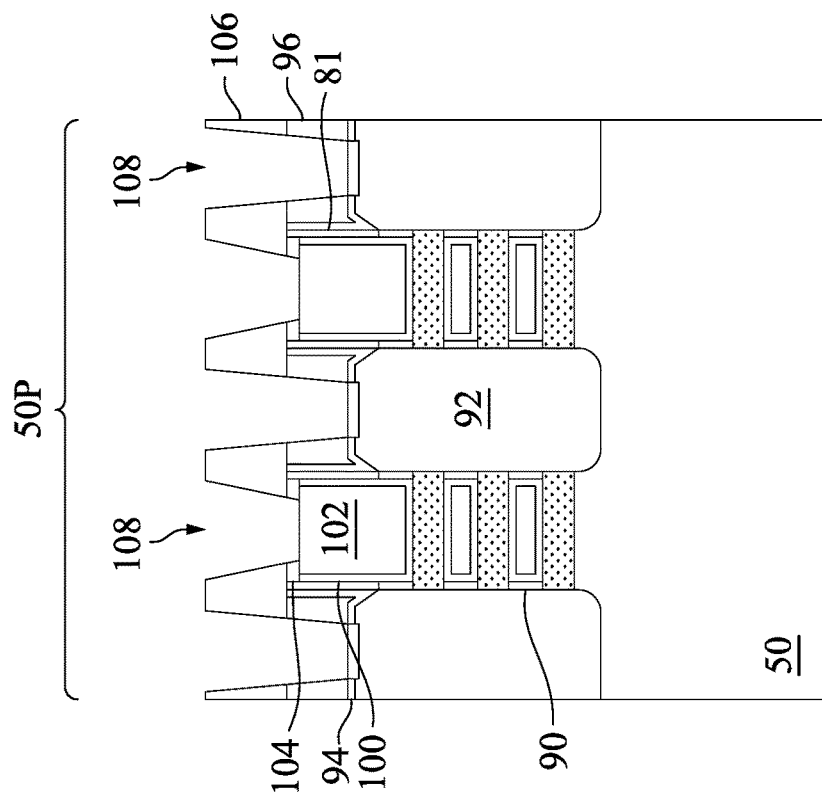
Figure 31B:
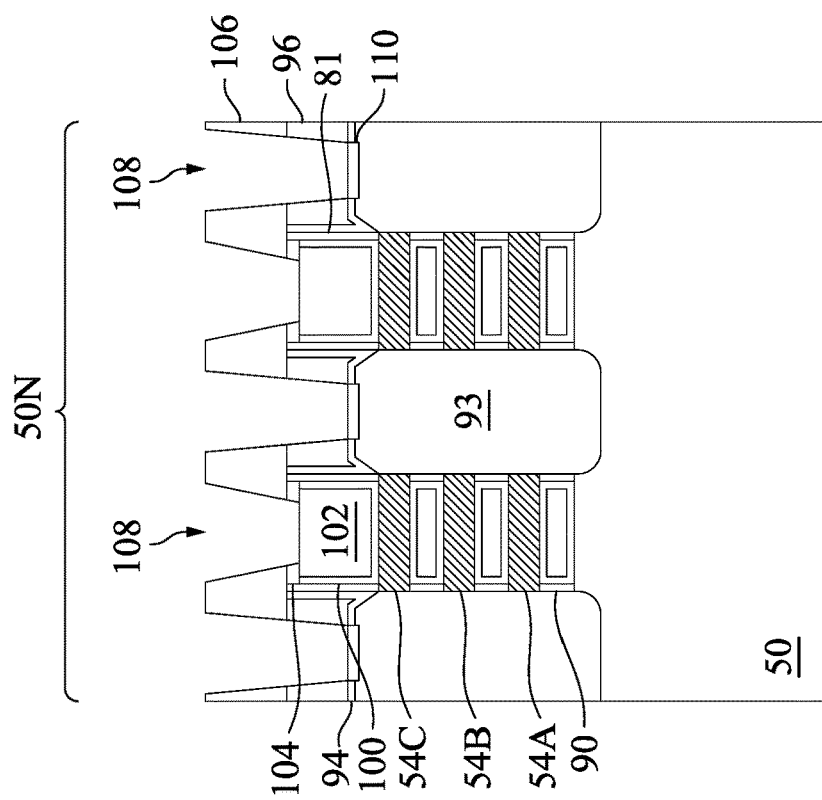
Figure 31C:
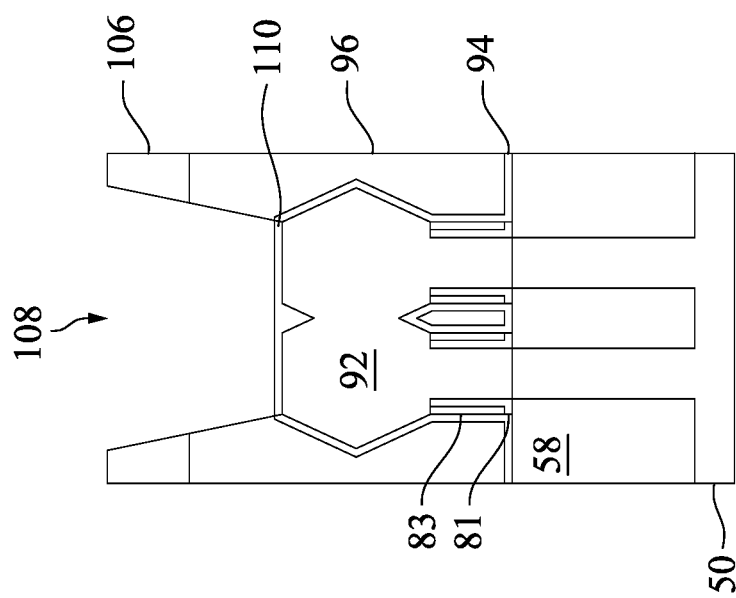

In FIGS. 31A-31C, the second ILD 106, the first ILD 96, the CESL 94, and the gate masks 104 are etched to form third recesses 108 exposing surfaces of the epitaxial source/drain regions 92 and 93 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and 93 and/or the gate structure, and a bottom of the third recesses 108 may be level with (e.g., at a same level, or having a same distance from the substrate), or lower than (e.g., closer to the substrate) the epitaxial source/drain regions 92 and 93 and/or the gate structure. Although FIG. 31B illustrate the third recesses 108 as exposing the epitaxial source/drain regions 92 and 93 and the gate structure in a same cross section, in various embodiments, the epitaxial source/drain regions 92 and 93 and the gate structure may be exposed in different cross-sections, thereby reducing the risk of shorting subsequently formed contacts. After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 and 93 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Figure 32A:
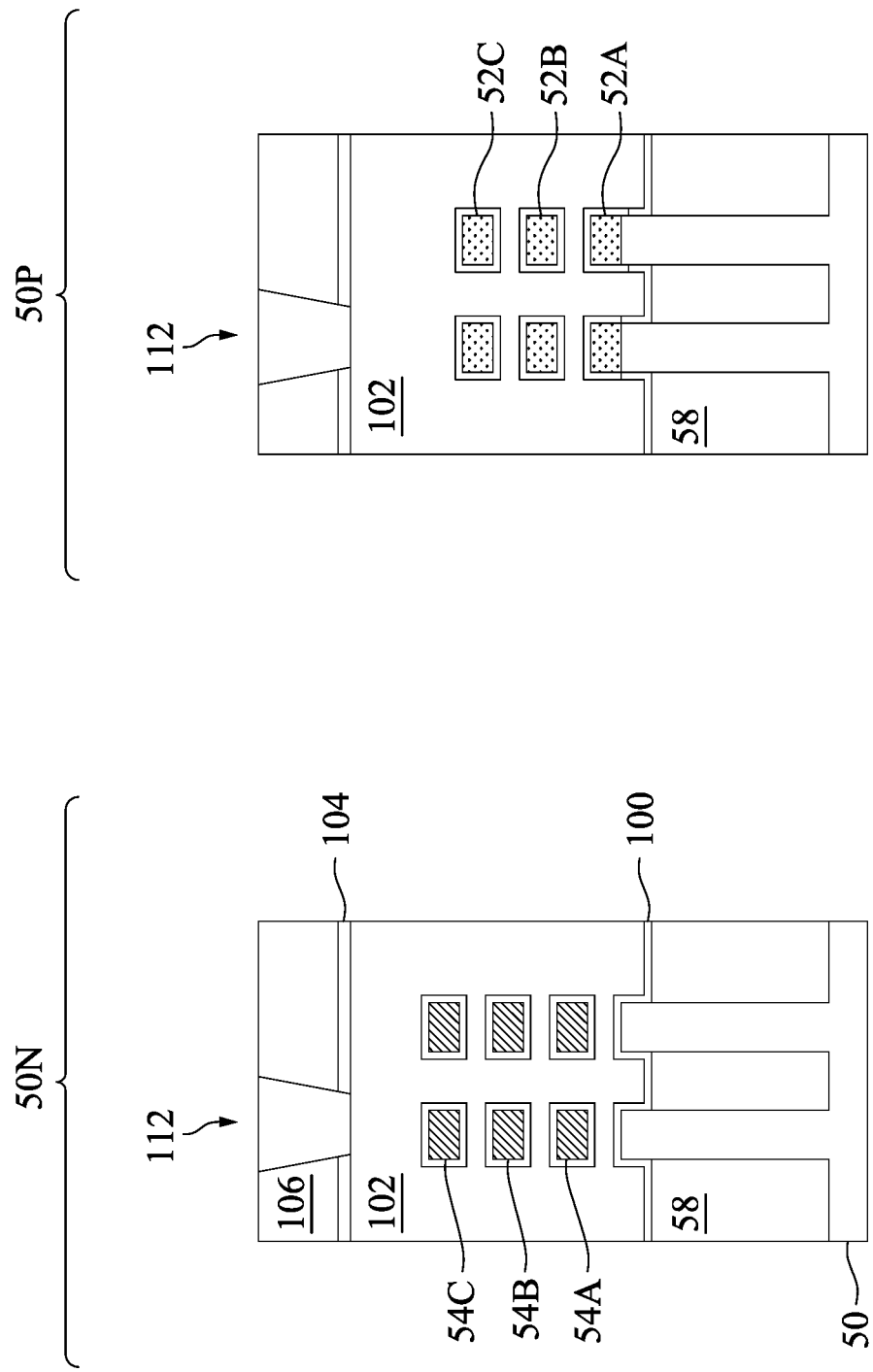
Figure 32B:
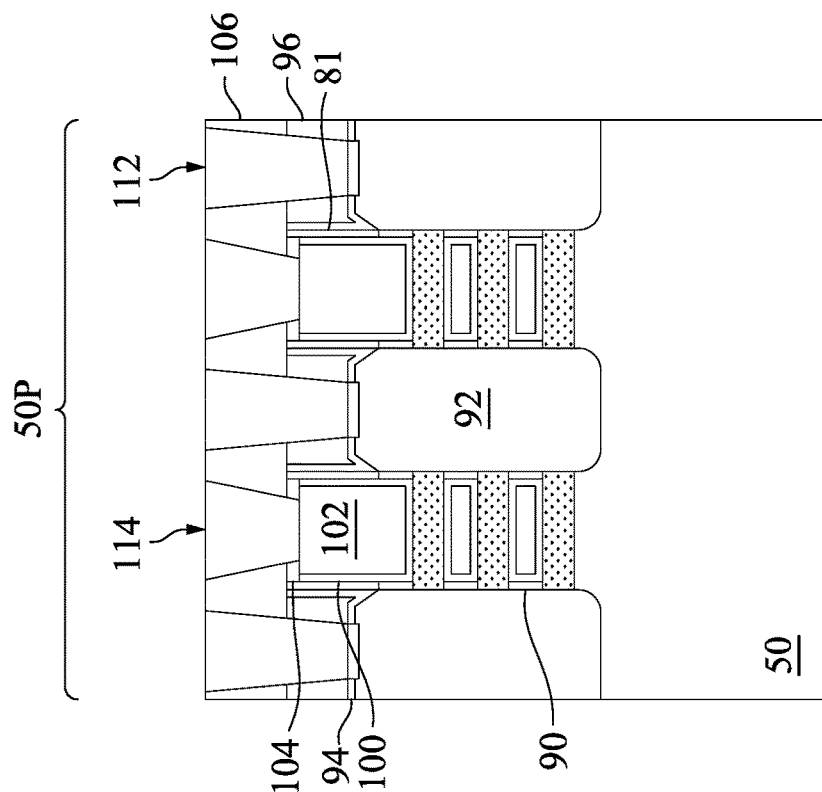
Figure 32B:
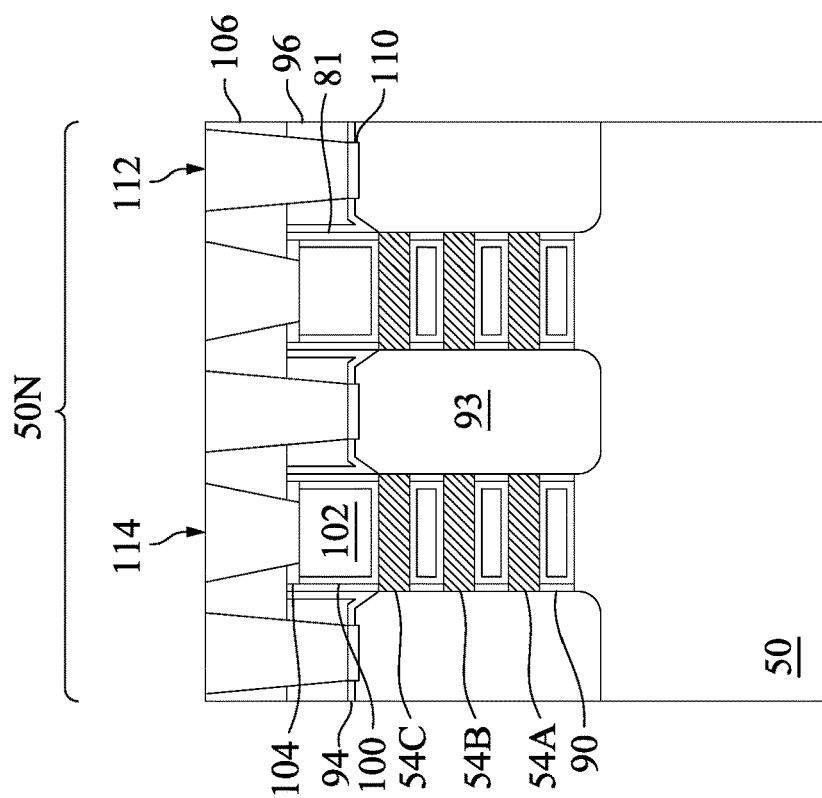
Figure 32C:
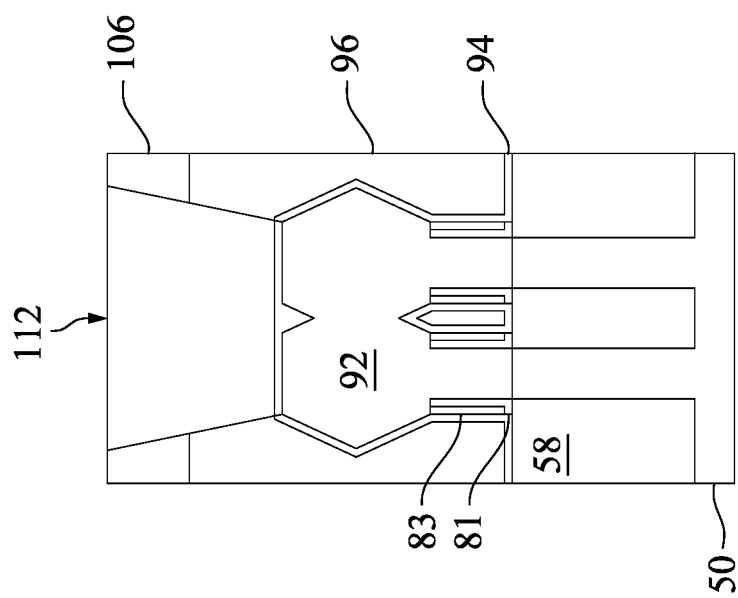

Next, in FIGS. 32A-C, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer 114 and a conductive material 118, and is electrically coupled to the underlying conductive feature (e.g., gate structure 102 and/or silicide region 110 in the illustrated embodiment). The contacts 114 are electrically coupled to the gate structure 102 and may be referred to as gate contacts, and the contacts 112 are electrically coupled to the silicide regions 110 and may be referred to as source/drain contacts. The barrier layer 114 may include titanium, titanium nitride, tantalum, tantalum nitride, or the like. The conductive material 118 may be copper, a copper alloy, silver, gold, tungsten, cobalt, aluminum, nickel, or the like. A planarization process, such as a CMP, may be performed to remove excess material from a surface of the second ILD 106.

Although FIGS. 32A-C illustrate a contact 112 extending to each of the epitaxial source/drain regions 92 and 93, the contact 112 may be omitted from certain ones of the epitaxial source/drain regions 92 and 93. For example, as explained in greater detail below, conductive features (e.g., power rails) may be subsequently attached through a backside of one or more of the epitaxial source/drain regions 92 and 93. For these particular epitaxial source/drain regions 92 and 93, the source/drain contacts 112 may be omitted or may be a dummy contact that is not electrically connected to any overlying conductive lines (e.g., conductive lines features, see FIG. 21).

Various embodiments provide a metal-comprising mask during source/drain epitaxy processes for forming source/drain regions in n-type and p-type device regions of a semiconductor die. The metal-comprising mask protects structures in the n-type or p-type device regions of the die while source/drain regions for the other type device are grown. In some embodiments, the metal-comprising mask comprises aluminum oxide, hafnium oxide, aluminum nitride, or the like. It has been observed that a metal oxide may be less prone to absorb precursors flowed during the source/drain epitaxy. As a result, the precursors may remain on a surface of the metal-comprising mask, precursor residue may be more readily removed during wet clean processes to remove the metal-comprising mask, and defects can be reduced in the resulting device. Source/drain processing windows can also be advantageously improved. Further, the use of metal-comprising masks may allow for more bottom-up source/drain growth as the metal-comprising mask may leave a residue along sidewalls of an STI region that helps inhibit epitaxy growth along the <100> crystalline planes.

In an embodiment, a method includes etching a first recess adjacent a first dummy gate stack and a first fin; etching a second recess adjacent a second dummy gate stack and a second fin; epitaxially growing a first epitaxy region in the first recess; depositing a first metal-comprising mask over the first dummy gate stack, over the second dummy gate stack, over the first epitaxy region in the first recess, and in the second recess; patterning the first metal-comprising mask to expose the first dummy gate stack and the first epitaxy region; epitaxially growing a second epitaxy region in the first recess over the first epitaxy region; and after epitaxially growing the second epitaxy region, removing remaining portions of the first metal-comprising mask. Optionally, in some embodiments, the first metal-comprising mask comprises aluminum oxide, aluminum nitride, or hafnium oxide. Optionally, in some embodiments, the method further includes growing a third epitaxy region in the second recess while growing the first epitaxy region in the first recess; depositing a second metal-comprising mask over the first dummy gate stack, over the second dummy gate stack, over the second epitaxy region, and over the third epitaxy region in the second recess; patterning the second metal-comprising mask to expose the second dummy gate stack and the third epitaxy region; epitaxially growing a fourth epitaxy region in the second recess over the third epitaxy region; and after epitaxially growing the fourth epitaxy region, removing remaining portions of the second metal-comprising mask. Optionally, in some embodiments, the first epitaxy region and the second epitaxy region provides a first source/drain region for a first transistor, wherein the third epitaxy region and the fourth epitaxy region provides a second source/drain region for a second transistor, and wherein the second transistor is a different type than the first transistor. Optionally, in some embodiments, after patterning the first metal-comprising mask, metal residue of the first metal-comprising mask remains over the first epitaxy region. Optionally, in some embodiments, epitaxially growing the second epitaxy region comprises flowing a hydrogen-comprising precursor in the first recess and over the first metal-comprising mask, and wherein removing the remaining portions of the first metal-comprising mask comprises removing precursor residue of the hydrogen-comprising precursor with the remaining portions of the first metal-comprising mask. Optionally, in some embodiments, wherein the precursor residue is bonded to a surface of the first metal-comprising mask. Optionally, in some embodiments, wherein the hydrogen-comprising precursor is $SiH_4$, $Si_2H_6$, or $SiH_2C_2$.

In an embodiment, a method includes etching a first recess in a first fin, wherein the first fin comprises a first plurality of semiconductor layers; etching a second recess in a second fin, wherein the second fin comprises a second plurality of semiconductor layers; depositing a first aluminum oxide layer over bottom surfaces and sidewalls of the first recess and the second recess; removing the first aluminum oxide layer from the first recess; epitaxially growing a first epitaxy region in the first recess while the first aluminum oxide layer covers the second recess; and removing the first aluminum oxide layer from the second recess. Optionally, in some embodiments, the method further includes depositing a second aluminum oxide layer over the first epitaxy region and over bottom surfaces and sidewalls of the second recess; removing the second aluminum oxide layer from the second recess; epitaxially growing a second epitaxy region in the second recess while the second aluminum oxide layer covers the first epitaxy region; and removing the second aluminum oxide layer from over the first epitaxy region. Optionally, in some embodiments, epitaxially growing the first epitaxy region comprises flowing a hydrogen-comprising precursor over the first aluminum oxide layer, and wherein residue of the hydrogen-comprising precursor bonds to a surface of the first aluminum oxide layer. Optionally, in some embodiments, removing the first aluminum oxide layer from the second recess comprises removing the hydrogen-comprising precursor bonded to the surface of the first aluminum oxide layer. Optionally, in some embodiments, the method further includes prior to depositing the first aluminum oxide layer, epitaxially growing a third epitaxy region in the first recess while epitaxially growing a fourth epitaxy region in the second recess.

In an embodiment, a device includes a first fin; a shallow trench isolation region adjacent the first fin; a first epitaxial source/drain region extending into the first fin, wherein the first epitaxial source/drain region comprises: a first epitaxy region; and a second epitaxy region over the first epitaxy region, wherein the second epitaxy region comprises a different material than the first epitaxy region; a first metal residue between the first epitaxial source/drain region and the shallow trench isolation region; and a gate over the first fin. Optionally, in some embodiments, the first metal residue is disposed between the first epitaxy region and the second epitaxy region. Optionally, in some embodiments, the device father includes a second fin, wherein the shallow trench isolation region is between the first fin and the second fin; a second epitaxial source/drain region extending into the second fin; a second metal residue between the second epitaxial source/drain region and the shallow trench isolation region. Optionally, in some embodiments, the second metal residue and the first metal residue each comprise aluminum. Optionally, in some embodiments, an aluminum concentration in a first region is greater than $10^{19}$ at/cm$^3$, wherein the first region has a first lateral boundary extending through the first fin and a second lateral boundary extending through the second fin. Optionally, in some embodiments, the first fin comprises a plurality of nanostructures, and wherein gate structure is disposed around each of the plurality of nanostructures. Optionally, in some embodiments, the first metal residue comprises hafnium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   etching a first recess adjacent a first dummy gate stack and a first fin;
   etching a second recess adjacent a second dummy gate stack and a second fin;
   epitaxially growing a first epitaxy layer of a first source/drain region in the first recess;
   depositing a first metal-comprising mask to overlap the first dummy gate stack, overlap the second dummy gate stack, overlap the first epitaxy layer in the first recess, and overlap sidewalls and a bottom surface of the second recess;
   patterning the first metal-comprising mask to expose the first dummy gate stack and the first epitaxy layer;
   epitaxially growing a second epitaxy layer of the first source/drain region in the first recess and overlapping the first epitaxy layer of the first source/drain region while masking the sidewalls and the bottom surface of the second recess with remaining portions of the first metal-comprising mask; and
   after epitaxially growing the second epitaxy layer, removing the remaining portions of the first metal-comprising mask from the second recess, wherein epitaxially growing the second epitaxy layer comprises flowing a hydrogen-comprising precursor in the first recess and over the first metal-comprising mask, and wherein removing the remaining portions of the first metal-comprising mask comprises removing precursor residue of the hydrogen-comprising precursor with the remaining portions of the first metal-comprising mask.

2. The method of claim 1, wherein the first metal-comprising mask comprises aluminum oxide, aluminum nitride, or hafnium oxide.

3. The method of claim 1, further comprising:
growing a third epitaxy layer of a second source/drain region in the second recess while growing the first epitaxy layer in the first recess;
depositing a second metal-comprising mask over the first dummy gate stack, over the second dummy gate stack, over the second epitaxy layer, and over the third epitaxy layer in the second recess;
patterning the second metal-comprising mask to expose the second dummy gate stack and the third epitaxy layer;
epitaxially growing a fourth epitaxy layer of the second source/drain region in the second recess over the third epitaxy layer; and
after epitaxially growing the fourth epitaxy layer, removing remaining portions of the second metal-comprising mask.

4. The method of claim 3, wherein a first source/drain region is a different conductivity type than the second source/drain region.

5. The method of claim 1, wherein after patterning the first metal-comprising mask, metal residue of the first metal-comprising mask remains over the first epitaxy layer.

6. The method of claim 1, wherein the precursor residue is bonded to a surface of the first metal-comprising mask.

7. The method of claim 1, wherein the hydrogen-comprising precursor is $SiH_4$, $Si_2H_6$, or $SiH_2C_2$.

8. A method comprising:
etching a first recess in a first fin, wherein the first fin comprises a first plurality of semiconductor layers;
etching a second recess in a second fin, wherein the second fin comprises a second plurality of semiconductor layers;
depositing a first aluminum oxide layer over bottom surfaces and sidewalls of the first recess and the second recess;
fully removing the first aluminum oxide layer from the first recess;
after fully removing the first aluminum oxide layer from the first recess, epitaxially growing a first epitaxy region in the first recess while the first aluminum oxide layer covers an entirety of the second recess, wherein epitaxially growing the first epitaxy region comprises flowing a hydrogen-comprising precursor in the first recess and over remaining portions of the first aluminum oxide layer in the second recess, and wherein a precursor residue of the hydrogen-comprising precursor is bonded to the remaining portions of the first aluminum oxide layer in the second recess; and
fully removing the first aluminum oxide layer from the second recess.

9. The method of claim 8 further comprising:
depositing a second aluminum oxide layer over the first epitaxy region and over bottom surfaces and sidewalls of the second recess;
removing the second aluminum oxide layer from the second recess;
epitaxially growing a second epitaxy region in the second recess while the second aluminum oxide layer covers the first epitaxy region; and
removing the second aluminum oxide layer from over the first epitaxy region.

10. The method of claim 8, wherein epitaxially growing the first epitaxy region comprises flowing a hydrogen-comprising precursor over the first aluminum oxide layer, and wherein residue of the hydrogen-comprising precursor bonds to a surface of the first aluminum oxide layer.

11. The method of claim 10, wherein removing the first aluminum oxide layer from the second recess comprises removing the hydrogen-comprising precursor bonded to the surface of the first aluminum oxide layer.

12. The method of claim 8 further comprising prior to depositing the first aluminum oxide layer, epitaxially growing a third epitaxy region in the first recess while epitaxially growing a fourth epitaxy region in the second recess.

13. A method comprising:
etching a first source/drain recess in a first fin on a first region of a substrate, wherein a first gate stack is disposed over and along sidewalls of the first fin;
etching a second source/drain recess in a second fin on a second region of the substrate, wherein a second gate stack is disposed over and along sidewalls of the second fin;
depositing a first metal-comprising mask over the first region of the substrate and the second region of the substrate, the first metal-comprising mask in direct contact with a first lateral surface of a first semiconductor material in the first source/drain recess, and the first metal-comprising mask in direct contact with a second lateral surface of a second semiconductor material in the second source/drain recess;
patterning the first metal-comprising mask to remove the first metal-comprising mask from over the first region of the substrate, wherein patterning the first metal-comprising mask exposes the first lateral surface of the first semiconductor material in the first source/drain recess;
epitaxially growing a first epitaxial region of a first source/drain region in direct contact with the first lateral surface of the first semiconductor material in the first source/drain recess while masking the second gate stack and the second lateral surface of the second semiconductor material in the second source/drain recess with the first metal-comprising mask, wherein epitaxially growing the first epitaxy region comprises flowing a hydrogen-comprising precursor in the first source/drain recess and over the remaining portions of the first metal-comprising mask, and wherein a precursor residue of the hydrogen-comprising precursor is bonded to the remaining portions of the first metal-comprising mask; and
removing remaining portions of the first metal-comprising mask.

14. The method of claim 13, further comprising:
after removing the remaining portions of the first metal-comprising mask, depositing a second metal-comprising mask over the first region of the substrate and the second region of the substrate;
patterning the second metal-comprising mask to expose the second region of the substrate, wherein patterning the second metal-comprising mask exposes the second lateral surface of the second semiconductor material in the second source/drain recess;
after patterning the second metal-comprising mask, epitaxially growing a second epitaxy region in direct contact with the second lateral surface of the second semiconductor material in the second source/drain recess while masking the first gate stack and the first source/drain recess with the second metal-comprising mask; and
removing remaining portions of the second metal-comprising mask.

15. The method of claim 13, wherein the first metal-comprising mask comprises aluminum oxide.

16. The method of claim 15, wherein the hydrogen-comprising precursor is $SiH_4$.

17. The method of claim 13, wherein removing the remaining portions of the first metal-comprising mask comprises removing the precursor residue of the hydrogen-comprising precursor.

18. The method of claim 9, wherein depositing the second aluminum oxide layer over the first epitaxy region and over bottom surfaces and sidewalls of the second recess comprises depositing the second aluminum oxide layer over the first epitaxy region and over bottom surfaces and sidewalls of the second recess after fully removing the first aluminum oxide layer from the second recess.

19. The method of claim 8, wherein the hydrogen-comprising precursor is $SiH_4$.

20. The method of claim 8, wherein fully removing the first aluminum oxide layer from the second recess comprises removing the hydrogen-comprising precursor with the first aluminum oxide layer.

* * * * *